United States Patent
Yuasa et al.

(10) Patent No.: US 6,914,757 B2
(45) Date of Patent: Jul. 5, 2005

(54) MAGNETORESISTANCE EFFECT ELEMENT, MAGNETIC HEAD AND MAGNETIC REPRODUCING SYSTEM

(75) Inventors: Hiromi Yuasa, Yokohama (JP); Hiroaki Yoda, Kawasaki (JP); Yuzo Kamiguchi, Yokohama (JP); Tomohiko Nagata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 09/961,171

(22) Filed: Sep. 24, 2001

(65) Prior Publication Data

US 2002/0039265 A1 Apr. 4, 2002

(30) Foreign Application Priority Data

Sep. 29, 2000 (JP) .................................... 2000-301118

(51) Int. Cl.$^7$ ................................................ G11B 5/39
(52) U.S. Cl. .................. 360/322; 360/324.1; 360/324.2
(58) Field of Search .............................. 360/322, 324.1, 360/324.11, 324.12, 324.2

(56) References Cited

U.S. PATENT DOCUMENTS

| | | | |
|---|---|---|---|
| 5,666,248 A | | 9/1997 | Gill ........................ 360/324.1 |
| 5,715,121 A | * | 2/1998 | Sakakima et al. ........ 360/324.2 |
| 5,731,937 A | * | 3/1998 | Yuan ........................ 360/322 |
| 6,077,618 A | * | 6/2000 | Sakakima et al. .......... 428/693 |
| 6,198,609 B1 | * | 3/2001 | Barr et al. .................... 360/322 |
| 6,452,764 B1 | * | 9/2002 | Abraham et al. ......... 360/324.2 |
| 6,456,465 B1 | * | 9/2002 | Louis et al. ................. 360/319 |
| 6,490,139 B1 | * | 12/2002 | Hayashi et al. ............. 360/322 |
| 6,590,750 B2 | * | 7/2003 | Abraham et al. ......... 360/324.2 |
| 2001/0036045 A1 | * | 11/2001 | Kondo ........................ 360/322 |
| 2002/0097533 A1 | * | 7/2002 | Funayama et al. ........ 360/324.1 |
| 2002/0135948 A1 | * | 9/2002 | Funayama et al. ........ 360/324.1 |
| 2002/0154453 A1 | * | 10/2002 | Ikeda .......................... 360/322 |
| 2003/0035251 A1 | * | 2/2003 | Asida et al. ................. 360/322 |

FOREIGN PATENT DOCUMENTS

KR    1998-024097    7/1998

OTHER PUBLICATIONS

M. N. Baibich, et al., Physical Review Letters, vol. 61, No. 21, pp. 2472–2475, "Giant Magnetoresistance of (001) Fe(001)Cr Magnetic Superlattices ", Nov. 21, 1988.

(Continued)

*Primary Examiner*—Jefferson Evans
(74) *Attorney, Agent, or Firm*—Oblon, Spivak, McClellandm Maier & Neustadt, P.C.

(57) ABSTRACT

A magnetoresistance effect element includes a magnetization fixed layer in which the direction of magnetization is substantially fixed to one direction, a magnetization free layer in which the direction of magnetization varies in response to an external magnetic field, and a non-magnetic intermediate layer formed between the magnetization fixed layer and the magnetization free layer. The magnetoresistance effect element has a resistance varying in response to a relative angle between the direction of magnetization in the magnetization fixed layer and the direction of magnetization in the magnetization free layer, the resistance being detected when a sense current is applied to the film planes of the magnetization fixed layer, the non-magnetic intermediate layer, and the magnetization free layer in a direction substantially perpendicular thereto. The film area of the non-magnetic intermediate layer is smaller than the film area of each of the magnetization fixed layer and the magnetization free layer, the magnetoresistance effect element has a single conductive part with a film area smaller than the film area of each of the magnetoresistance effect element, and the magnetoresistance effect element is configured such that the sense current flows only through the single conductive part.

9 Claims, 20 Drawing Sheets

OTHER PUBLICATIONS

D. W. Chapman, et al., IEEE Transactions on Magnetics, vol. 25, No. 5, pp. 3689–3691, "A New, Horizontal MR Head Structure", Sep. 1989.

B. Dieny, et al., Physical Review B, vol. 45, No. 2, pp. 806–813, "Giant Magnetoresistance of Magnetically Soft Sandwiches: Dependence on Temperature and on Layer Thicknesses", Jan. 1, 1992.

B. Dieny, et al., J. Appl. Phys., vol. 69, No. 8, pp. 4774–4779, "Magnetotransport Properties of Magnetically Soft Spin–Valve Structures (Invited)", Apr. 15, 1991.

M. A. M. Gijs, et al., Physical Review Letters, vol. 70, No. 21, pp. 3343–3346, "Perpendicular Giant Magnetoresistance of Microstructured Fe/Cr Magnetic Multilayers From 4.2 to 300 K", May 24, 1993.

M. A. Howson, et al., J. Phys. Condens. Matter, vol. 11, pp. 5717–5722, "Magnetic Multilayers of Fe/Au: Role of the Electron Mean Free Path", 1999.

S. S. P. Parkin, et al., Physical Review Letters, vol. 64, No. 19, pp. 2304–2307, "Oscillations in Exchange Coupling and Magnetoresistance in Metallic Superlattice Structures: Co/Ru, Co/Cr. and Fe/Cr", May 7, 1990.

* cited by examiner

MAGNETORESISTANCE EFFECT ELEMENT, MAGNETIC HEAD AND MAGNETIC REPRODUCING SYSTEM

CROSS REFERENCE TO RELATED APPLICATION

This application is based upon and claims the benefit of priority from the prior Japanese Patent Applications No. 2000-301118, filed on Sep. 29, 2000; the entire contents of which are incorporated herein by reference.

BACKGROUND OF THE INVENTION

1. Field of the Invention

The present invention generally relates to a magnetoresistance effect element, a magnetic head and a magnetic reproducing system. More specifically, the invention relates to a magnetoresistance effect element for causing a sense current to flow in a direction perpendicular to the plane of the element to detect an external magnetic field, a magnetic head using the same, and a magnetic reproducing system using the same.

2. Description of Related Art

Conventionally, the readout of magnetic information recorded in a magnetic recording medium has been carried out by a method for relatively moving a reproducing magnetic head having a coil with respect to the recording medium to generate an electromagnetic induction to detect a voltage which is induced in the coil by the electromagnetic induction. On the other hand, an electromagnetic effect element (which will be hereinafter referred to as an "MR element") has been developed. The electromagnetic effect element is being used for a magnetic sensor, and mounted on a magnetic head (which will be hereinafter referred to as an MR head) for use in a magnetic reproducing system, such as a hard disk drive.

In recent years, the size of a magnetic recording medium is decreasing, and the capacity thereof is increasing, so that the relative velocity of a reproducing magnetic head to the magnetic recording medium is decreasing during the readout of magnetic information. For that reason, it is required to provide an MR head capable of taking out a large output even if the relative velocity is small.

According to such a request, it has been reported that a multilayer film, such as Fe/Cr or Fe/Cu, wherein ferromagnetic metal films and magnetic metal films are alternately stacked on certain conditions, i.e., a so-called "artificial lattice film", has a giant magnetoresistance effect (see Phys. Rev. Lett. 61 2474 (1988), Phys. Rev. Lett. 64 2304 (1990)). However, since magnetization is saturated in the artificial lattice film, a required magnetic field is high therein, so that the artificial lattice film is not suitable for the material of a film for an MR head.

On the other hand, there has been reported an example where a large magnetoresistance effect was realized even if a ferromagnetic layer is not antiferromagnetically connected in a multilayer film having a sandwich structure of ferromagnetic layer/non-magnetic layer/ferromagnetic layer. That is, a magnetic field due to exchange bias is applied to one of two ferromagnetic layers, which sandwich a non-magnetic layer therebetween, to fix magnetization, and the magnetization of the other ferromagnetic layer is inverted by an external magnetic field (a magnetic field due to signal or the like). Thus, by changing the relative angle between the magnetizing directions of the two ferromagnetic layers which sandwich the non-magnetic layer therebetween, a large magnetoresistance effect is obtained. A multilayer film of such a type is called a "spin-valve" (see Phys. Rev. B 45 806 (1992), J. Appl. Phys. 69 4774 (1981)). Since the spin-valve can saturate magnetization in a low magnetic field, the spin-valve is suitable for MR heads. However, since the rate of change in magnetic resistance of elements which have been already put to practical use is only about 20% at the maximum, it is required to improve the rate of change in magnetic resistance.

By the way, most of conventional MR elements have a type wherein a sense current is caused to flow in a direction parallel to the plane of an MR film constituting the MR element. This is called "CIP (current in plane)". On the other hand, there is an MR element wherein a sense current is caused to flow in a direction perpendicular to the plane of an MR film. This is called "CPP (current perpendicular to plane)". It has been reported that CPP can obtain a rate of change in magnetic resistance ten times as large as that of CIP (J. Phys. Condens. Matter. 11 5717 (1999)), and it is not impossible to obtain a rate of change of 100%.

However, if a sense current is caused to flow in a direction perpendicular to the plane of the MR film, there is a problem in that the electric resistance is very small, so that the output decreases. Therefore, it has been attempted to decrease the area itself of the MR film to raise the value of resistance to increase the output (Phys. Rev. Lett. 70 3343 (1993)). However, in the method for decreasing the area itself of the MR film, it is limited to cause the MR film to be a single magnetic domain.

In addition, if a sense current is caused to flow in a direction perpendicular to the plane of the MR film, an annular magnetic field due to current is generated in the plane of the MR film. This annular magnetic field causes to prevent a magnetization free layer, in which magnetization rotates with respect to the magnetic field due to signal, from being a single magnetic domain.

On the other hand, most of conventional MR heads have a "shielded" construction wherein an MR film is sandwiched between shields. In the case of the shielded construction, a floating magnetic field from a magnetic recording medium is directly detected by a spin-valve. However, in recent years, the recording density is further enhanced, so that a "yoke type" head for efficiently incorporating a magnetic flux from a magnetic recording medium into a magnetization free layer of a spin-valve via a magnetic flux guide (yoke) once has been proposed.

However, after the inventor's study, it was revealed that, in many magnetic heads represented by yoke type magnetic heads, it is required to define an active region, in which the detection of magnetism of an MR film is carried out, for various reasons.

As an example of this circumstance, a "planar type" head of yoke type heads will be described below.

FIG. 31 is a schematic perspective view showing the construction of a principal part of a planar type head. That is, the planar type head has a construction that a pair of flat yokes 20, 20 are arranged in parallel to the plane of a recording media 200. An MR film 100 constituting an MR element is provided so as to be magnetically coupled to the yokes 20, 20.

The recording medium 200 is provided with recording bits 200B along a recording track 200T. The magnetic flux due to signal from each of the recording bits 200B is supplied to a magnetic circuit, which is formed by the yoke 20, the MR film 100 and the yoke 20, to be detected.

According to such a planar type construction, the length of a magnetic path to the MR film 100 is shortened, so that the magnetic flux can be efficiently led to a spin-valve (see IEEE Trans. Mag. 25, 3689 (1989)).

However, the width 20W of the yoke 20 of the planar type head is wider than the width 200W of the recording track 200T of the recording medium which has been acceleratively narrowed in recent years. For that reason, it is required to limit the active region of the MR film 100 for actually reading the magnetic flux.

In addition, in the planar type head, it is desired that the magnetic permeability is uniform and great so that the magnetic flux due to signal from the recording medium 200 efficiently enters the yoke 20 without being asymmetric and further enters the magnetization free layer of the MR film 100. Therefore, if a pair of magnetically hard materials 30, 30 are arranged so as to be perpendicular to the longitudinal directions of the track 200T of the medium so that the magnetization of the yoke 20 and the magnetization free layer is perpendicular to the track direction, the magnetic permeability can be high and uniform.

However, if a CPP type MR element for realizing a high magnetoresistance effect is used, it is required to provide an electrode portion (pillar electrode) for causing a sense current to flow through the MR film in a direction perpendicular thereto. If an annular magnetic field due to current from this electrode portion exceeds a magnetization fixing force due to the pair of magnetically hard materials 30, 30, the magnetization distribution of the magnetization free layer of the yoke 20 and the MR film 100 varies, so that the magnetic permeability is not uniform.

Moreover, if the CPP type MR element is used, the MR film 100 is sandwiched between top and bottom electrodes (not shown). Therefore, it was revealed that the magnetic field due to current from a portion of these electrodes parallel to the MR film 100 also influences the magnetization distribution in the yoke 20 and the magnetization free layer of the MR film 100.

The above described problems are not only caused in the planar type heads, but the problems are also commonly caused in most of yoke type heads or heads having other structures. For example, the same problems are caused in the "shielded" heads.

SUMMARY OF THE INVENTION

It is therefore an object of the present invention to eliminate the aforementioned problems and to provide a magnetoresistance effect element capable of precisely defining the active region of an MR film in a CPP type MR element and of effectively suppressing the influence of a magnetic field due to current from an electrode, and a magnetic head and magnetic reproducing system using the same.

In order to accomplish the aforementioned object, according to a first aspect of the present invention, a magnetoresistance effect element comprises: a magnetization fixed layer in which the direction of magnetization is substantially fixed to one direction; a magnetization free layer in which the direction of magnetization varies in response to an external magnetic field; and a non-magnetic intermediate layer formed between the magnetization fixed layer and the magnetization free layer, the magnetoresistance effect element having a resistance varying in response to a relative angle between the direction of magnetization in the magnetization fixed layer and the direction of magnetization in the magnetization free layer, the film area of the non-magnetic intermediate layer being smaller than the film area of each of the magnetization fixed layer and the magnetization free layer, and a sense current detecting the variation of the resistance being applied to the film planes of the magnetization fixed layer, the non-magnetic intermediate layer and the magnetization free layer in a direction substantially perpendicular thereto.

According to a second aspect of the present invention, a magnetoresistance effect element comprises: a stacked film including a magnetization fixed layer in which the direction of magnetization is substantially fixed to one direction, and a magnetization free layer in which the direction of magnetization varies in response to an external magnetic field; and an electrode connected to a part of a principal plane of the stacked film, the magnetoresistance effect element having a resistance varying in response to a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, and the electrode comprising a pillar electrode portion substantially perpendicularly extending from the principal plane of the stacked film, a first feed portion being connected to the pillar electrode portion and extending from the pillar electrode portion substantially in parallel to the principal plane of the stacked film, and a second feed portion being connected to the first feed portion and extending from the first feed portion substantially in parallel to the principal plane.

According to a third aspect of the present invention, a magnetoresistance effect element comprises: a stacked film including a magnetization fixed layer in which the direction of magnetization is substantially fixed to one direction, and a magnetization free layer in which the direction of magnetization varies in response to an external magnetic field; and two electrodes, each of which is connected to a part of a corresponding one of both principal planes of the stacked film, the magnetoresistance effect element having a resistance varying in response to a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, and each of the two electrodes comprising a pillar electrode portion substantially perpendicularly extending from the corresponding one of the both principal planes of the stacked film, a first feed portion being connected to the pillar electrode portion and extending from the pillar electrode portion substantially in parallel to the both principal planes of the stacked film, and a second feed portion being connected to the first feed portion and extending from the first feed portion substantially in parallel to the both principal planes.

According to a fourth aspect of the present invention, a magnetoresistance effect element comprises: a stacked film including a magnetization fixed layer in which the direction of magnetization is substantially fixed to one direction, and a magnetization free layer in which the direction of magnetization varies in response to an external magnetic field; and an electrode connected to a part of a principal plane of the stacked film, the magnetoresistance effect element having a resistance varying in response to with a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, and the electrode comprising a pillar electrode portion substantially perpendicularly extending from the principal plane of the stacked film, and a feed portion extending substantially in parallel to the principal plane of the stacked film, the pillar electrode portion having two conductive layers in the central portion and outer peripheral portion thereof, and the sense current being caused to flow in the opposite directions to each other in the central portion and the outer peripheral portion.

According to a fifth aspect of the present invention, a magnetoresistance effect element comprises: a stacked film including a magnetization fixed layer in which the direction of magnetization is substantially fixed to one direction, and a magnetization free layer in which the direction of magnetization varies in response to an external magnetic field; and an electrode connected to a part of a principal plane of the stacked film, the magnetoresistance effect element having a resistance varying in response to a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, and the electrode comprising a pillar electrode portion substantially perpendicularly extending from the principal plane of the stacked film, and a feed portion extending substantially in parallel to the principal plane of the stacked film, the magnetoresistance effect element further comprising a magnetic shield provided around the pillar electrode portion.

According to a sixth aspect of the present invention, a magnetic head comprises: a pair of yokes arranged so as to face each other via a magnetic gap; and a magnetoresistance effect element magnetically coupled to the pair of yokes, the pair of yokes having magnetization arranged in a predetermined direction, and the magnetoresistance effect element comprising: a stacked film including a magnetization fixed layer in which the direction of magnetization is substantially fixed to one direction, and a magnetization free layer in which the direction of magnetization varies in response to an external magnetic field; and an electrode connected to a part of a principal plane of the stacked film, the magnetoresistance effect element having a resistance varying in response to a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, and the shape of a connecting portion for connecting the principal plane to the electrode having an edge portion being inclined in a magnetization rotating direction of the magnetization free layer from a direction perpendicular to the magnetizing direction of the yokes.

According to a seventh aspect of the present invention, a magnetic head comprises: a pair of yokes arranged so as to face each other via a magnetic gap; and a magnetoresistance effect element magnetically coupled to the pair of yokes, the pair of yokes having magnetization being arranged in a predetermined direction, and the magnetoresistance effect element comprising: a first stacked film including a magnetization fixed layer in which the direction of magnetization is substantially fixed to one direction; a second stacked film including a magnetization free layer in which the direction of magnetization varies in response to an external magnetic field; and a non-magnetic intermediate layer provided between the first stacked layer and the second stacked layer, the magnetoresistance effect element having a resistance varying in response to a relative angle between the direction of magnetization in the magnetization fixed layer and the direction of magnetization in the magnetization free layer, the area of a contact portion of a principal plane of the first stacked film contacting the non-magnetic intermediate layer being smaller than the area of the principal plane of the first stacked film, and the area of a contact portion of a principal plane of the second stacked film contacting the non-magnetic intermediate layer being smaller than the area of the principal plane of the second stacked film, a sense current detecting the variation of the resistance being applied to the film planes of the magnetization fixed layer, the non-magnetic intermediate layer and the magnetization free layer in a direction substantially perpendicular thereto, the shape of a connecting portion for connecting the non-magnetic intermediate layer to the principal plane of the first stacked film having an edge portion being inclined in a magnetization rotating direction of the magnetization free layer from a direction perpendicular to the magnetizing direction of the yokes.

According to an eighth aspect of the present invention, a magnetic head comprises: a pair of yokes being arranged so as to face each other via a magnetic gap; and a magnetoresistance effect element provided on the pair of yokes and magnetically coupled to the pair of yokes, the pair of yokes having magnetization arranged in a predetermined direction, and the magnetoresistance effect element comprising: a stacked film including a magnetization fixed layer in which the direction of magnetization is substantially fixed to one direction, and a magnetization free layer in which the direction of magnetization varies in response to an external magnetic field; a top electrode connected to a part of an upper principal plane of the stacked film; a bottom electrode connected to a lower principal plane of the stacked film, the magnetoresistance effect element having a resistance varying in response to a relative angle between the direction of magnetization in the magnetization fixed layer and the direction of magnetization in the magnetization free layer, a sense current detecting the variation of the resistance being applied to the film planes of the magnetization fixed layer and the magnetization free layer via the electrode in a direction substantially perpendicular to the magnetization fixed layer and the magnetization free layer, the top electrode having a pillar electrode portion substantially perpendicularly extending from the principal plane of the stacked film, and a feed portion extending substantially in parallel to the principal plane of the stacked film, the bottom electrode extending in a direction perpendicular to the direction of magnetization of the yokes, the feed portion of the top electrode being provided so that the sense current flowing through the feed portion is anti-parallel to a sense current flowing through the bottom electrode.

In the magnetic head according to any one of the above described sixth through eighth aspects, a method for applying magnetization, which is arranged in a predetermined direction, to the pair of yokes may be a method for annealing the yokes in a magnetic field, or a method for applying a magnetic field due to bias which is caused by a biasing film of a magnetically hard film or an antiferromagnetic film.

According to a ninth aspect of the present invention, a magnetic head has a magnetoresistance effect element according to any one of the above described first through fifth aspect.

According to a tenth aspect of the present invention, a magnetic reproducing system has any one of the above described magnetic head, and is capable of reading magnetic information stored in a magnetic recording medium.

In other words, according to another aspect of the present invention, a magnetoresistance effect film wherein a current is applied to the element in a direction perpendicular to the film surface of the element and which comprises: at least one magnetization free layer in which magnetization rotates in response to an external magnetic field; and at least one magnetization pinned layer in which magnetization is fixed, wherein a pillar electrode is provided between a portion for allowing a sense current to flow in parallel to the film surface of the element of the electrode and the element, the sectional area of a portion of the pillar electrode contacting the element being smaller than the area of any portion of the element.

According to another aspect of the present invention, a magnetoresistance effect film wherein a current is applied to the element in a direction perpendicular to the film surface of the element and which comprises: at least one magnetization free layer in which magnetization rotates in accordance with an external magnetic field; and at least one magnetization pinned layer in which magnetization is fixed, wherein a pillar electrode is provided between a portion for allowing a sense current to flow in parallel to the film surface of the element of the electrode and the element, the sectional area of a portion of the pillar electrode contacting the element being smaller than the area of any portion of the element if being viewed from an approaching direction of a magnetic field due to signal or a direction perpendicular to the approaching direction.

In the magnetoresistance effect element according to the second aspect, the sectional area of the pillar portion may substantially linearly increase from a surface contacting the element toward a surface of a portion in which a current flows in parallel and which contacts the electrode.

Alternatively, in the magnetoresistance effect element according to the second aspect, the sectional area of the pillar portion may simply increase from a surface contacting the element toward a surface in which a current flows in parallel to the film surface of the element and which contacts the electrode, and its increasing rate may vary on the way.

Alternatively, in the magnetoresistance effect element according to the second aspect, the pillar portion may be divided into two portions having a small rate of change in sectional area.

Moreover, the contact area of the pillar portion contacting the magnetoresistance effect film may be $S_{Lead}/S_{MR} > 2000$ assuming that the contact area of the pillar portion contacting the feed portion is $S_{Lead}$.

Alternatively, of the two portions having the small rate of change in sectional area, the height of a portion having a small mean sectional area may be 30 nm or less.

In addition, the electrode area of a portion of the bottom and top electrodes contacting the pillar electrode may be narrowed so as to be the same as the sectional area of the pillar electrode.

That is, in the case of a CPP element, the active region of the MR element is defined by the area of a portion, in which a sense current flows, of a ferromagnetic/non-magnetic interface which mainly provides the magnetoresistance effect element. In the case of a CPP type MR, the sectional area of the pillar electrode must be smaller than the size of the element in order to increase the electrical resistance while maintaining the magnetic characteristics of the MR element. By the pillar electrode in this case, the active region of the MR element can be defined.

In addition, in order to decrease the magnetic field due to current from the pillar electrode, the sectional area of the pillar electrode is varied to decrease the area of a surface contacting the element. Moreover, the pillar electrode is formed by two portions in which the sectional area does not so vary, and the sectional area and height of a portion contacting the element are defined to be predetermined ranges. If the magnetic field due to current from the pillar electrode is decreased to be smaller than the magnetization fixing force due to a pair of magnetically hard materials, the magnetization in the yokes and the magnetization free layer of the MR element does not so rotate. For that reason, the magnetic flux from the recording medium substantially symmetrically enters the magnetization free layer.

Alternatively, the sense current is caused to go and return in the pillar electrode to prevent the magnetic field due to current from being applied, so that the magnetic field due to the sense current is canceled. Alternatively, a magnetic shield is provided around the pillar electrode to prevent the magnetic field due to current from being applied to the element. If the current is caused to go and return in the pillar electrode, the magnetic field due to current to the outside of the electrode is canceled. In addition, if the shield is provided, the magnetic field due to current is not applied to the element and the yokes. Therefore, the magnetic flux from the recording medium symmetrically enter the magnetization free layer.

Moreover, in the case of a planar yoke head, the magnetization of the yokes may rotate due to the influence of the magnetic field due to current which could not have been removed. In this case, there is some possibility that the magnetization of the yokes may be deviated from a direction parallel to the track longitudinal direction of the recording medium to read a magnetic flux due to signal from an adjacent track. In order to prevent this, the shape of the cross section of the pillar electrode or the pillar non-magnetic material for defining the active region of the element is designed to extend along the flow of the magnetic flux so as to efficiently read only a signal from a track directly below the active region. When the magnetic field due to current from the pillar electrode can not be ignored, the magnetic flux from the recording medium asymmetrically enters the yokes and the magnetization free layer of the MR element to some extent. In expectation of this, if the cross section of the pillar electrode is designed to be asymmetric so as to extend along the flow of the magnetic flux, the regenerative efficiency is improved.

In addition, the electrode is arranged so that the current applying direction in an electrode portion parallel to the plane of the element is parallel to the track direction of the medium. According to such an arrangement, the direction of the magnetic field due to current from this portion is the same direction as the magnetization fixing direction of the yokes and magnetization free layer due to the pair of magnetically hard materials. In addition, if the direction of current in the top electrode is anti-parallel to that in the bottom electrode, the magnetic field due to current applied to the yokes can be reduced. If the electrode in a portion parallel to the plane of the element is parallel to the track direction, the magnetic field due to current is generated in a direction perpendicular to the track. Since this direction is the same as the magnetization fixing direction due to the pair of magnetically hard materials, there is no influence on the magnetization distribution in the yokes and magnetization free layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DESCRIPTION OF THE EMBODIMENTS

Referring now to the accompanying drawings, the embodiments of the present invention will be described below.

FIRST EMBODIMENT

First, as the first embodiment of the present invention, the basic construction for restricting a current applying region to an MR film will be described below.

Figure 1:
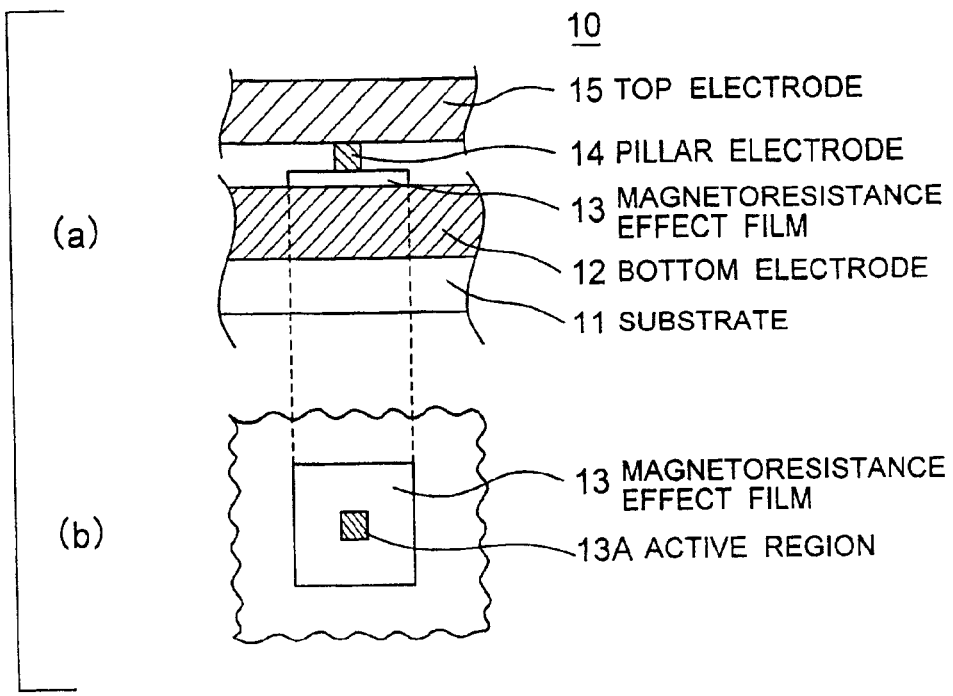
FIGS. 1(a) and 1(b) are sectional and plan views showing the first embodiment of a magnetoresistance effect element according to the present invention.

FIG. 1 is a conceptual drawing showing the construction of a principal part of a magnetoresistance effect element in this embodiment. That is, FIG. 1(a) is its sectional view, and FIG. 1(b) is its plan view. The right side in FIG. 1 corresponds to an external magnetic field approaching surface. For example, if the magnetoresistance effect element is mounted on a shielded head, the external magnetic field approaching surface is arranged so as to face a magnetic recording medium, and if the magnetoresistance effect element is mounted on a planar type head, the external magnetic field approaching surface is supported on one of magnetic yokes.

In this embodiment, an MR element 10 comprises a bottom electrode 12, a magnetoresistance effect film 13, a pillar electrode 14 and a top electrode 15 which are stacked on a substrate 11 in that order. These are surrounded by an insulating material (not shown). The magnetoresistance effect film 13 has a stacked construction wherein a magnetization fixed layer (pinned layer), non-magnetic intermediate layer (spacer layer) and magnetization free layer (free layer) (not shown) are stacked. One embodiment of the present invention is characterized in that the sectional area of the pillar electrode 14 is smaller than the sectional area of each of the layers constituting the magnetoresistance effect film 13.

A sense current is caused to flow from the top electrode 15 to the pillar electrode 14, the magnetoresistance effect film 13 and the bottom electrode 12, or in the opposite direction thereto. That is, with respect to the magnetoresistance effect film 13, the sense current flows in a direction perpendicular to the plane of the film.

Although the magnetoresistance effect film 13 is basically made of a metal, most of the sense current flows through a region contacting the pillar electrode 14. By utilizing this, an active region 13A can be defined by the sectional shape of the pillar electrode 14.

Although the shape of the active region 13A in which the pillar electrode 14 contacts the magnetoresistance effect film 13 may be any shape, it is effectively a shape approximating to a rectangle as shown in FIG. 1(b) in order to efficiently read a magnetic field due to signal from a magnetic recording medium.

MODIFIED EXAMPLE 1-1

Figure 2:
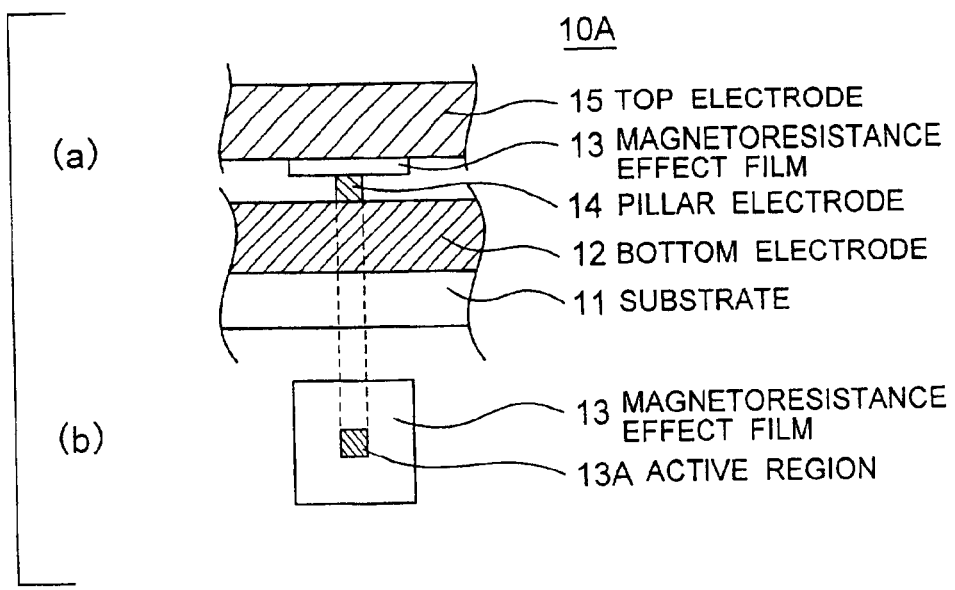
FIGS. 2(a) and 2(b) are conceptual drawings showing a first modified example of a magnetoresistance effect element in the first embodiment.

FIG. 2 is a conceptual drawing showing a first modified example of a magnetoresistance effect element in this embodiment. That is, FIG. 2(a) is its sectional view, and FIG. 2(b) is its plan view.

As shown in FIG. 2, the magnetoresistance effect element 10A in this modified example comprises a bottom electrode 12, a pillar electrode 14, a magnetoresistance effect film 13 and a top electrode 15 which are stacked on a substrate 11 in that order. In such a magnetoresistance effect element, an active region 13A can be similarly defined.

Although the shape of the active region 13A in which the pillar electrode 14 contacts the magnetoresistance effect film 13 may be any shape, it is effectively a shape approximating to a rectangle as shown in FIG. 2(b) in order to efficiently read a magnetic field due to signal from a magnetic recording medium.

MODIFIED EXAMPLE 1-2

Figure 3:
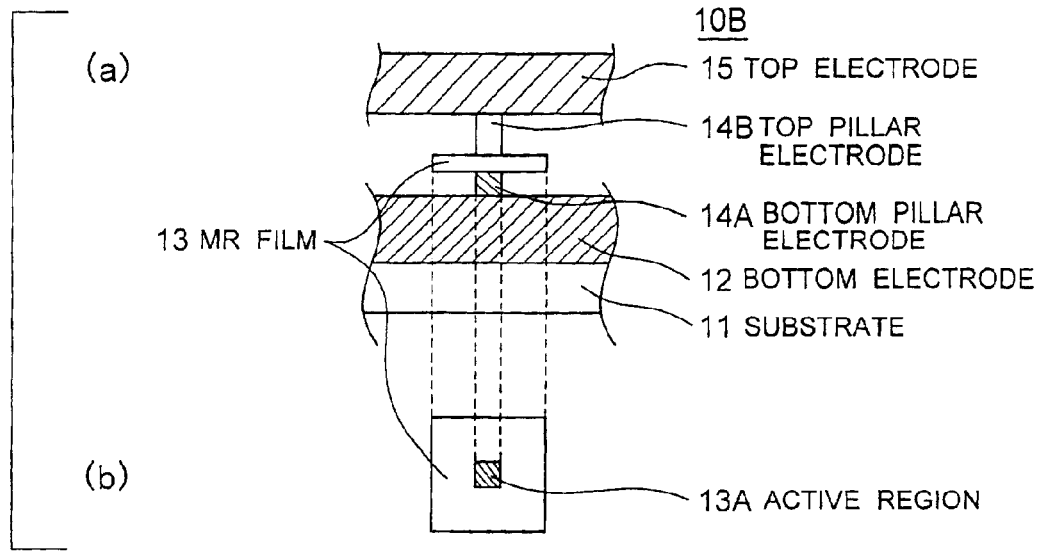
FIGS. 3(a) and 3(b) are conceptual drawings showing a second modified example of a magnetoresistance effect element in the first embodiment.

FIG. 3 is a conceptual drawing showing a second modified example of a magnetoresistance effect element in this embodiment. That is, FIG. 2(a) is its sectional view, and FIG. 2(b) is its plan view. The magnetoresistance effect element 10B in this modified example comprises a bottom electrode 12, a bottom pillar electrode 14A, a magnetoresistance effect film 13, a top pillar electrode 14B and a top electrode 15 which are stacked on a substrate 11 in that order.

Figure 4:
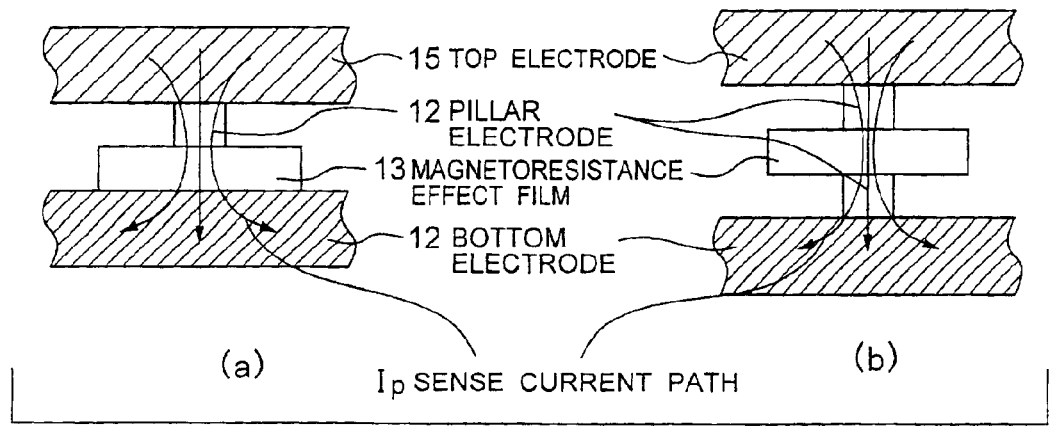
FIGS. 4(a) and 4(b) are conceptual drawings showing a current path in a magnetoresistance effect film 13.

FIG. 4 is a conceptual drawing showing a current path in the magnetoresistance effect element 13.

In the magnetoresistance effect elements shown in FIGS. 1 and 2, a component parallel to the plane of the magnetoresistance effect film 13 is generated in a current distribution in the film as shown in FIG. 4(a), so that the element is not a complete CPP type MR element.

As compared with this, in the second modified example shown in FIG. 3, the component parallel to the plane of the magnetoresistance effect film 13 disappears in the current distribution in the film as shown in FIG. 4(b), so that the CPP type MR element can be extracted. In addition, the active region 13A of the magnetoresistance effect film can be more effectively defined.

Although the shape of the active region 13A in which the top pillar electrode 14B and the bottom pillar electrode 14A contact the magnetoresistance effect film 13 may be any shape, it is effectively a shape approximating to a rectangle as shown in FIG. 3(b) in order to efficiently read a magnetic field due to signal from a magnetic recording medium.

MODIFIED EXAMPLE 1-3

Figure 5:
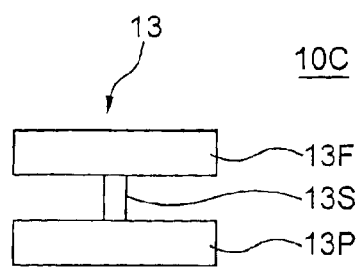
FIG. 5 is a conceptual drawing showing a sectional construction of a third modified example of a magnetoresistance effect element in the first embodiment.

FIG. 5 is a conceptual drawing showing a sectional construction of a third modified example of a magnetoresistance effect element in this embodiment. That is, in the magnetoresistance effect element 10C in this modified example, a non-magnetic intermediate layer 13S of a spin-valve which has a stacked film 13P having at least one magnetization fixed layer (pinned layer) and a stacked film 13F having at least one magnetization free layer (free layer) is patterned in the form of a pillar. However, the stacking order in this figure should not limited. Furthermore, electrodes (not shown) contact the top and bottom faces of the magnetoresistance effect film 13.

The interface between the non-magnetic intermediate layer 13S and the magnetization fixed layer and the interface between the non-magnetic intermediate layer 13S and the magnetization free layer have the interfacial effect of the magnetoresistance effect. In the element shown in FIG. 5, a current flows in a direction substantially perpendicular to these interfaces, so that the effects of a CPP type GMR can be extracted.

Although the shape of the active region in which the pillar spacer layer 13S contacts the pinned layer 13P and the free layer 13S may be any shape, it is effectively a shape approximating to a rectangle in order to efficiently read a magnetic field due to signal from a magnetic recording medium.

SECOND EMBODIMENT

As the second embodiment of the present invention, an embodiment of the structure shown in FIG. 1 which is applied to a shielded head will be described below.

Figure 6:
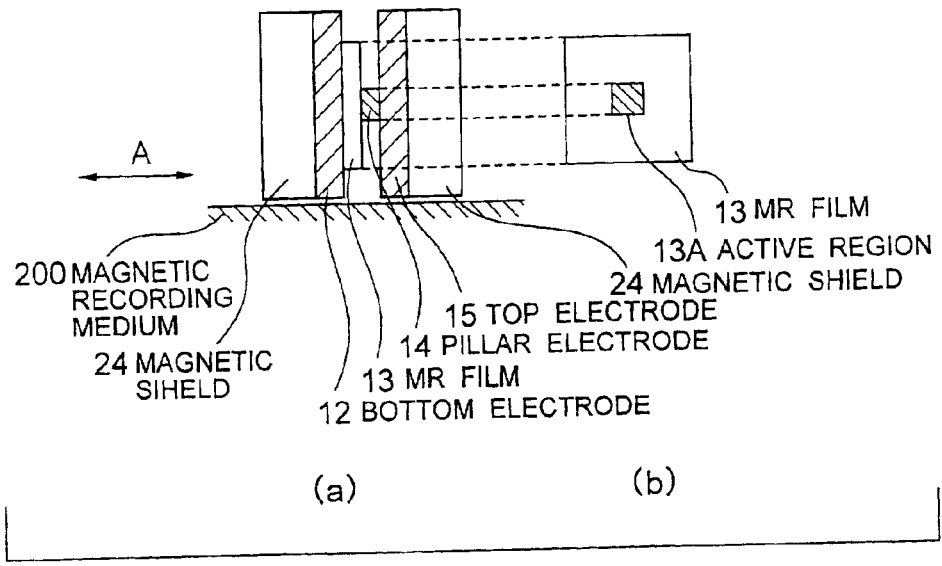
FIGS. 6(a) and 6(b) are conceptual drawings showing a principal part of a shielded head on which the magnetoresistance effect element illustrated in FIGS. 1(a) and 1(b) is mounted.

FIG. 6 is a conceptual drawing showing a principal part of a shielded head on which the magnetoresistance effect element illustrated in FIG. 1 is mounted. That is, FIG. 6(*a*) is a sectional view taken along a longitudinal direction of a recording track, and FIG. 6(*b*) is a sectional view taken along across direction of a recording track. In the figure, a magnetic recording medium 200 travels in directions of arrow A.

In the magnetic head in this embodiment, a magnetoresistance effect film 13 is sandwiched between a pair of magnetic shields 24 and 24, and is arranged so as to be perpendicular to the magnetic recording medium 200. In addition, a top electrode 12, a pillar electrode 14 and a top electrode 15 are provided as shown in the figure, so that an active region 13A is defined.

Figure 7:
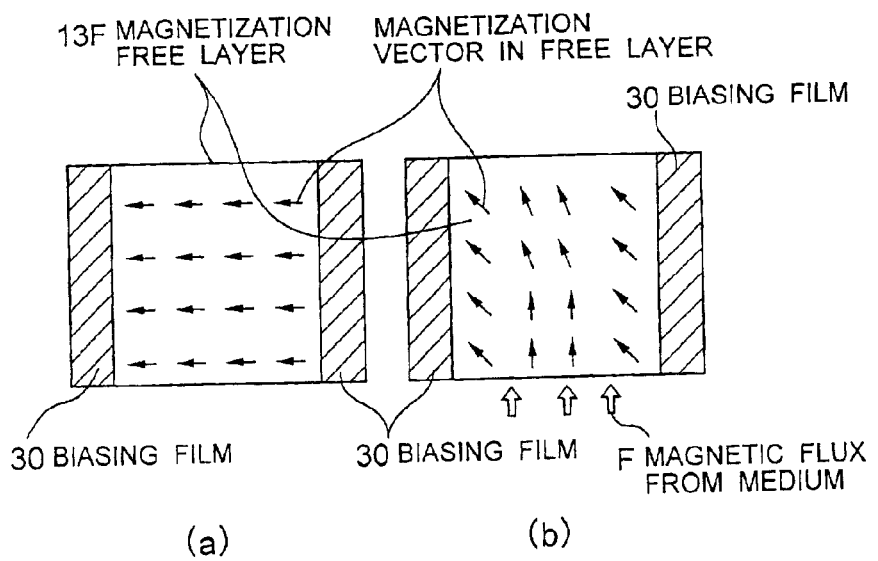
FIGS. 7(a) and 7(b) are conceptual drawings showing a magnetization distribution in a magnetization free layer (free layer) of a magnetoresistance effect element.

FIG. 7 is a conceptual drawing a magnetization distribution in a magnetization free layer (free layer) of the magnetoresistance effect film 13. A magnetic flux due to signal from the recording medium 13 enters the magnetization free layer of the magnetoresistance effect element 13 to rotate the magnetization of the magnetization free layer. Usually, in no magnetic field, as shown in FIG. 7(*a*), the magnetization (arrows) of the magnetization free layer is formed as a single magnetic domain by a magnetic field due to bias from a biasing film 30 so as to be perpendicular to an approaching magnetic field. If a magnetic flux F enters herein from the recording medium, the magnetization (arrows) of the magnetization free layer rotates as shown in FIG. 7(*b*), but the rotation angle thereof attenuates as the distance from the recording medium 200 increases. That is, the sensitivity is higher in a portion nearer to the recording medium 200.

Therefore, if the pillar electrode 14 is arranged in a portion nearer to the recording medium 200, only a portion having a high sensitivity of the magnetization free layer can be an active region 13A, so that it is possible to realize a high output.

Furthermore, in the construction of FIG. 6, each of the top electrode 15 and the bottom electrode 12 may also serve as a magnetic shield. In that case, the structure is simplified, and the fabricating process is shortened.

In FIG. 6, the magnetoresistance effect element may be an element in the above described modified example 1-1, 1-2 or 1-3.

THIRD EMBODIMENT

As the third embodiment of the present invention, a planar yoke head having a bias applying means will be described below.

Figure 8:
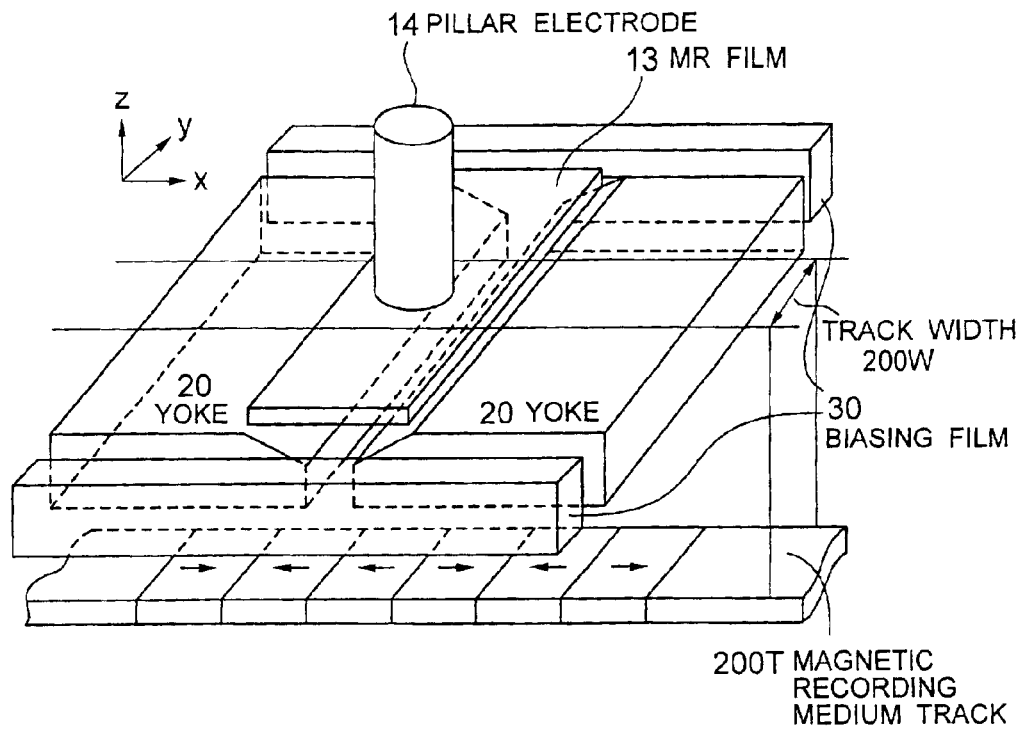
FIG. 8 is a perspective view showing a construction wherein the magnetoresistance effect element illustrated in FIG. 1 is mounted on a planar yoke head.

FIG. 8 is a perspective view showing the construction of a planar yoke head on which the magnetoresistance effect element illustrated in FIG. 1 is mounted. In this figure, the same reference numbers are given to the same element as those described above referring to FIGS. 1 through 7 and 31 to omit the detailed descriptions thereof. Furthermore, in this figure, top and bottom electrodes in a portion parallel to the plane of the film are omitted.

In this embodiment, a pair of yokes 20, 20 are sandwiched between a pair of biasing films 30 and 30 formed of a hard film of a magnetically hard material or an antiferromagnetic film, and the magnetization is formed as a single magnetic domain so as to be directed in a direction of y. Similarly, the magnetization of the magnetization free layer of a magnetoresistance effect film 13 is also aligned with the direction of y.

Figure 9:
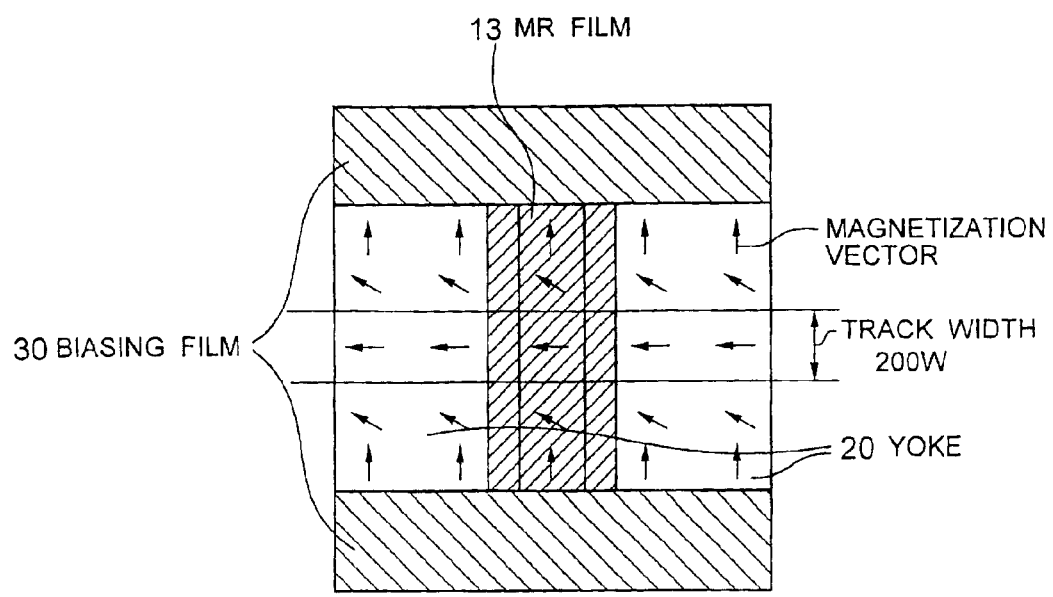
FIG. 9 is a conceptual drawing showing a magnetizing direction in the third embodiment of a head according to the present invention.

FIG. 9 is a conceptual drawing showing a magnetizing direction in the head in this embodiment.

As shown in this figure, a magnetic flux from a magnetic recording medium 200 mainly enters the yoke 20 in a portion above a track 200T, and the magnetization of the magnetization free layer is also greatly rotate only in the portion above the track 200T. Therefore, if the sectional area of a pillar electrode 14 is limited to a track width 200W as shown in FIG. 8 so that only a portion having a high sensitivity is an active region 13A (see FIG. 1), it is possible to improve the output.

Furthermore, also in this embodiment, the same effects can be obtained even if the magnetoresistance effect element in the above described modified example 1-1, 1-2 or 1-3 is mounted.

MODIFIED EXAMPLE 3-1

As a first modified example of this embodiment, a construction for applying a magnetic field due to bias to a yoke and a magnetization free layer will be described below.

Figure 10:
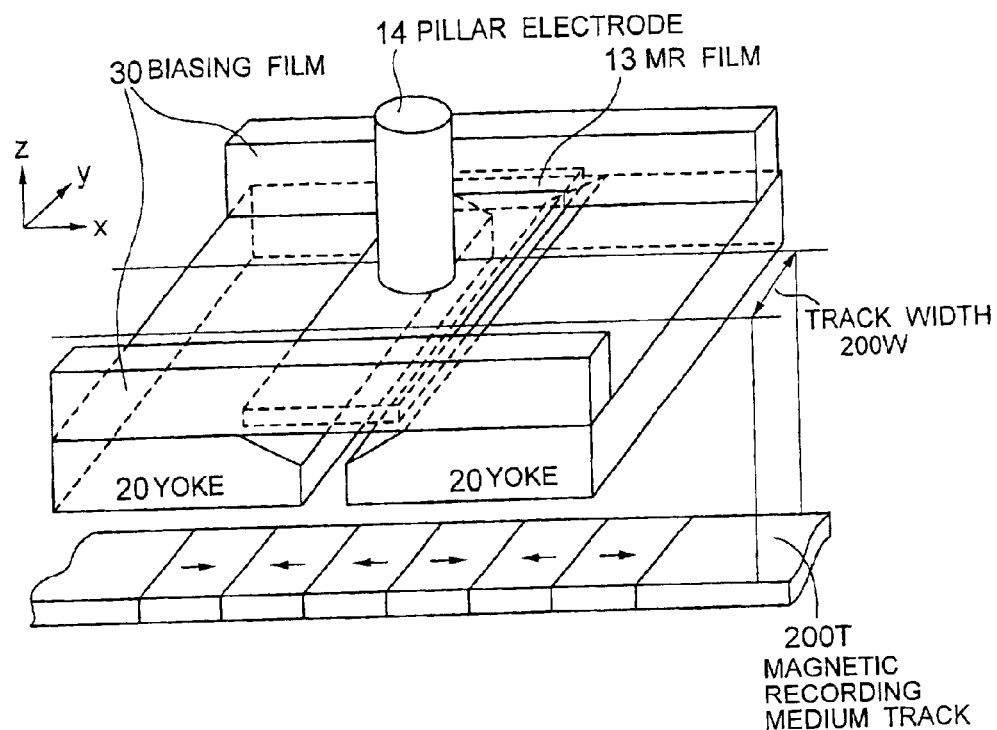
FIG. 10 is a perspective view showing the construction of a principal part of a modified example of a magnetic head in the third embodiment.

FIG. 10 is a schematic perspective view showing the construction of a principal part of a magnetic head in this modified example. Also in this figure, the same reference numbers are given to the same elements as those described above referring to FIGS. 1 through 9 and 31 to omit the detailed descriptions thereof.

In this modified example, a pair of biasing films 30, 30 of a magnetically hard film or an antiferromagnetic film are arranged on yokes 20 and a magnetization free layer. According to such a "patterned bias construction", an ideal magnetic field due to bias can be applied to the yokes 20 and the magnetization free layer.

MODIFIED EXAMPLE 3-2

As a second modified example of this embodiment, a construction having auxiliary yokes will be described below.

Figure 11:
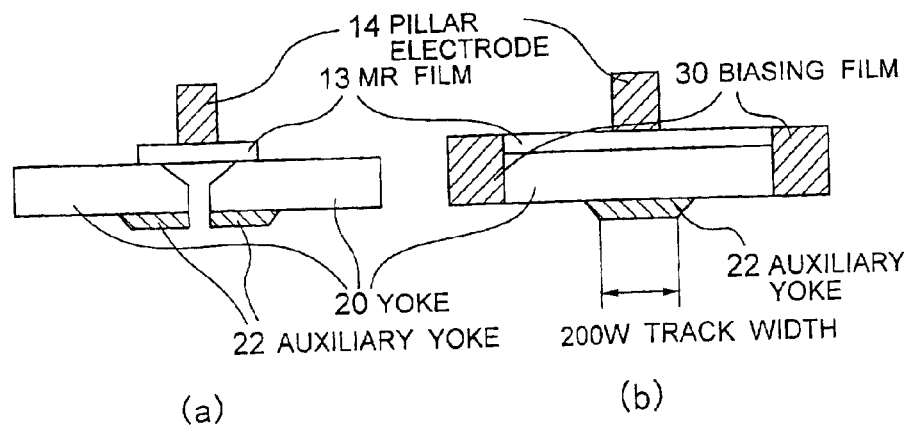
FIGS. 11(a) and 11(b) are sectional views of the magnetoresistance effect element in the third embodiment of the present invention, which is provided with an auxiliary yoke.

FIGS. 11(*a*) and 11(*b*) are schematic sectional views showing the construction of a principal part of a magnetic head in this modified example. Also in these figures, the same reference numbers are given to the same elements as those described above referring to FIGS. 1 through 10 and 31 to omit the detailed descriptions thereof.

In this modified example, auxiliary yokes 22 substantially having the same size as that of the width 200W of a recording track of a recording medium are added to the planar yoke head illustrated in FIG. 8. FIG. 11(a) shows that each yoke 20 shown in FIG. 10 has an auxiliary yoke 22 and FIG. 11(b) shows that the width 200W of the auxiliary yoke 22 has substantially the same size as the magnetic recording medium track 200T shown in FIG. 10. Thus, a magnetic flux due to a signal from the recording track is efficiently led to the yokes 20, and thus to the magnetization free layer of a magnetoresistance effect element 13. As a result, only the magnetization of a portion above the recording track ideally rotates, so that an active region 13A can be more conspicuously defined by arranging a pillar electrode 14 within the track width.

Of course, the same effects can be obtained even if the construction illustrated in any one of FIGS. 10, 20, 24 and 26 is provided with the same auxiliary yokes 22, 22.

FOURTH EMBODIMENT

As the fourth embodiment of the present invention, a concrete construction for suppressing the effects of an annular magnetic field generated by a pillar electrode will be described below.

Figure 12:
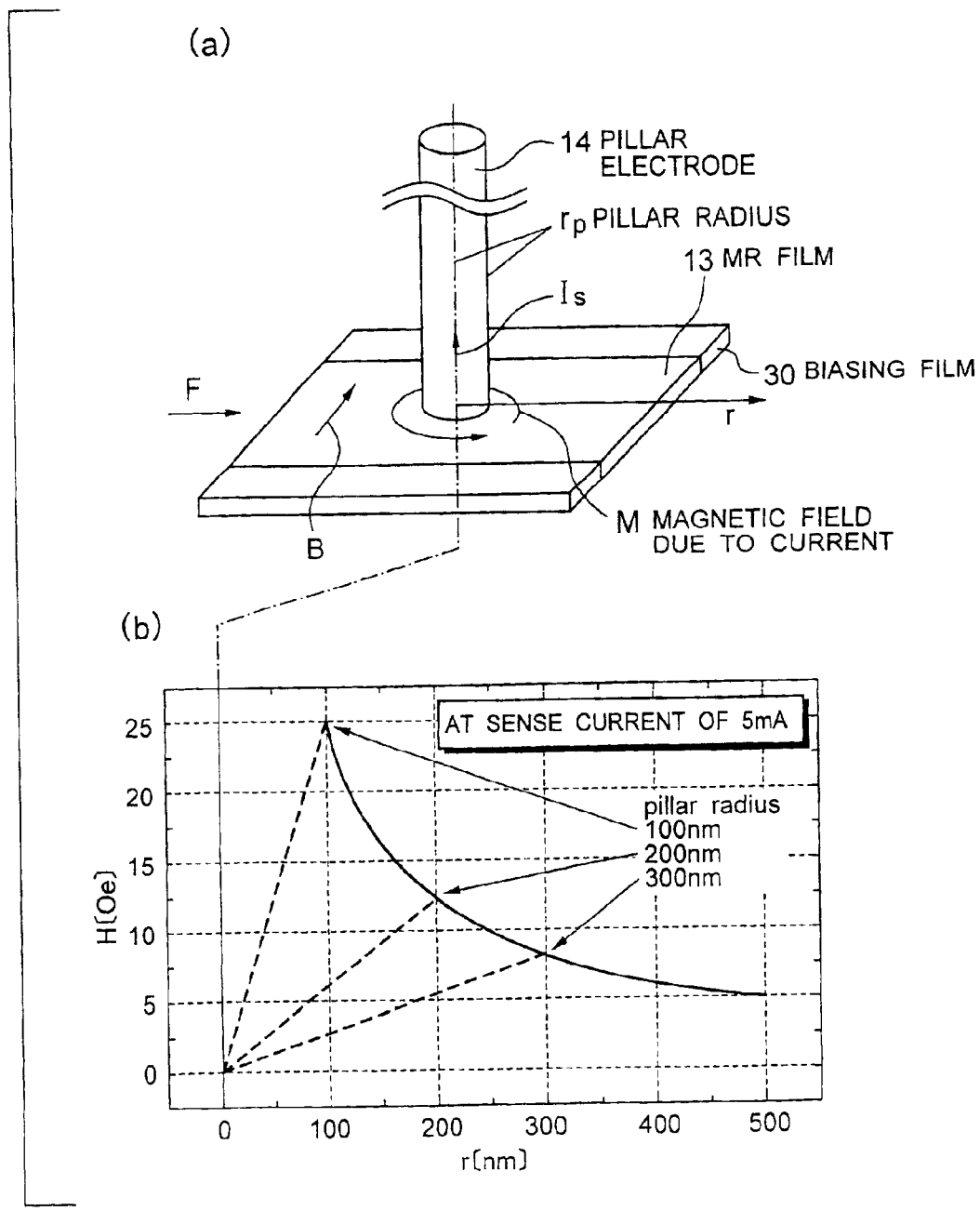
FIG. 12(a) is a perspective view showing a magnetic field due to current, which is generated when a sense current is caused to flow, and the direction of a magnetic field due to bias based on a magnetically hard film or an antiferromagnetic film, in the first embodiment of a magnetoresistance effect element according to the present invention.
FIG. 12(b) is a characteristic graph of the magnitude of an annular magnetic field due to current, which is generated in a magnetoresistance effect film when a sense current of 5 mA is caused to flow, with respect to the distance from the center of a pillar electrode.

FIG. 12(a) is a schematic diagram showing a principal part of the magnetoresistance effect element illustrated in FIG. 1. Biasing films 30 of a magnetically hard film or an antiferromagnetic film are provided on the front and rear sides in the figure, so that the magnetization free layer is formed as a single magnetic domain by a magnetic field due to bias generated by the biasing films 30.

It is assumed that the cross section of the pillar electrode 14 is circular and its height is infinitely long. If a sense current Is is caused to flow through such a pillar electrode 14 in a direction of arrow, an annular magnetic field due to current is applied to the magnetoresistance effect element 13 as shown by arrow M. If the magnetic field M due to current increases to such an extent that it can not be ignored, the magnetic permeability of a magnetic flux due to signal entering the magnetization free layer in a lateral direction in the figure is not uniform on the plane. Moreover, if the magnitude of the magnetic field M due to current exceeds the magnetic field B due to bias, the magnetization of the magnetization free layer rotates.

FIG. 12(b) is a graph showing the magnitude of a magnetic field M due to current at a position, which is spaced from the center of the pillar electrode 14 by a distance r, when a sense current Is of 5 mA is caused to flow. Furthermore, in this figure, the broken lines show a magnetic field distribution in the pillar electrode 14, and the solid line shows a magnetic field distribution outside of the pillar electrode 14. That is, the magnetic field due to current increases in the pillar electrode 14 as the distance from the center increases, has a peak on the outer wall of the electrode 14, and attenuates as the distance from the outer wall of the electrode 14 increases outwardly.

The locally applied maximum magnetic field greatly depends on the radius $r_p$ of the pillar electrode 14. For example, the maximum magnetic field is 25 Oe if the radius is 100 nm, it is 12.5 Oe if the radius is 200 nm, and it is 8.3 Oe if the radius is 300 nm. Thus, the maximum magnetic field due to current decreases as the radius $r_p$ increases. It can be therefore said that the radius $r_p$ of the pillar electrode 14 is preferably as large as possible.

Figure 13:
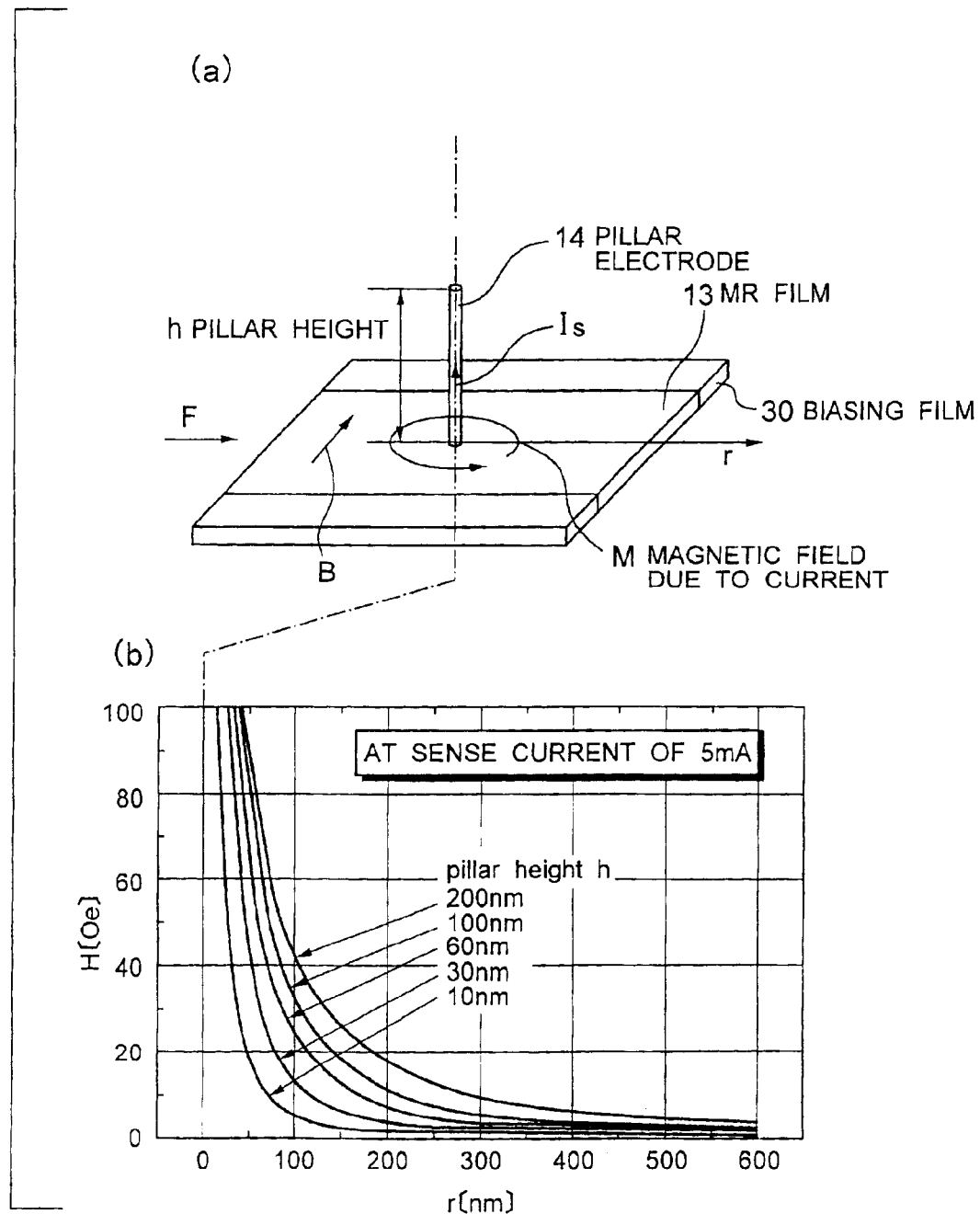
FIG. 13(a) is a perspective view showing a magnetic field due to current, which is generated when a sense current is caused to flow, and the direction of a magnetic field due to bias based on a magnetically hard film or an antiferromagnetic film, in the first embodiment of a magnetoresistance effect element according to the present invention.
FIG. 13(b) is a characteristic graph of the magnitude of an annular magnetic field due to current, which is generated in a magnetoresistance effect film when a sense current of 5 mA is caused to flow, with respect to the distance from the center of a pillar electrode.

FIG. 13(a) is a schematic diagram showing a principal part of the magnetoresistance effect element illustrated in FIG. 1. In this case, biasing films 30 of a magnetically hard film or an antiferromagnetic film are provided on the front and rear sides in the figure, so that the magnetization free layer is formed as a single magnetic domain by a magnetic field due to bias generated by the biasing films 30.

It is herein assumed that an infinitely thin linear electrode. If a sense current Is is caused to flow through such a linear electrode in a direction of arrow, an annular magnetic field is applied to the magnetoresistance effect element 13 as shown by arrow M. If the magnetic field M due to current increases to such an extent that it can not be ignored, the magnetic permeability of a magnetic flux F due to signal entering the magnetization free layer in a lateral direction in the figure is not uniform on the plane. Moreover, if the magnetic field M due to current exceeds the magnetic field B due to bias, the magnetization of the magnetization free layer rotates.

FIG. 13(b) is a graph showing the magnitude of a magnetic field M due to current at a position, which is spaced from the pillar electrode 14 by a distance r, when a sense current of 5 mA is caused to flow. The magnitude of the magnetic field M due to current greatly depends on the height h of the pillar electrode 14. For example, at a position of r=0.2 μm, the magnitude of the magnetic field M due to current is 1.25 Oe if the height h is 10 nm, it is 7.18 Oe if the height h is 60 nm, and it is 17.7 Oe if the height h is 200 nm. Thus, the magnitude of the magnetic field M due to current decreases as the height h increases. Because the intensity of the magnetic field M due to current at the position of the magnetoresistance effect film 13 is determined by the integral along longitudinal directions of the pillar electrode 14. It can be therefore said that the height h of the pillar electrode 14 must be designed to be smallish.

In view of the foregoing, the pillar electrode 14 is designed as follows.

First, the pillar electrode 14 must be thick in order to suppress the magnetic field M due to current. On the other hand, the sectional area of the pillar electrode 14 on a plane contacting the magnetoresistance effect film 13 is preferably small from the standpoint of the narrowing of the active region 13A and from the standpoint of the enhancement of the resistance of the CPP type GMR element.

In addition, the magnetic field M due to current can be reduced as the length of the pillar electrode 14 decreases. However, the height h of the pillar electrode 14 must be at least about 100 nm in order to ensure the electrical insulation between the magnetoresistance effect film 13, the top electrode 15 and the bottom electrode 12.

As a design simultaneously satisfying these conditions, for example, in the case of the magnetoresistance effect element illustrated in FIG. 1, the sectional area of a portion of the pillar electrode 14 near the top electrode 15 may be large, and the sectional area of a portion of the pillar electrode 14 near the magnetoresistance effect film 13 may be small.

Figure 14:
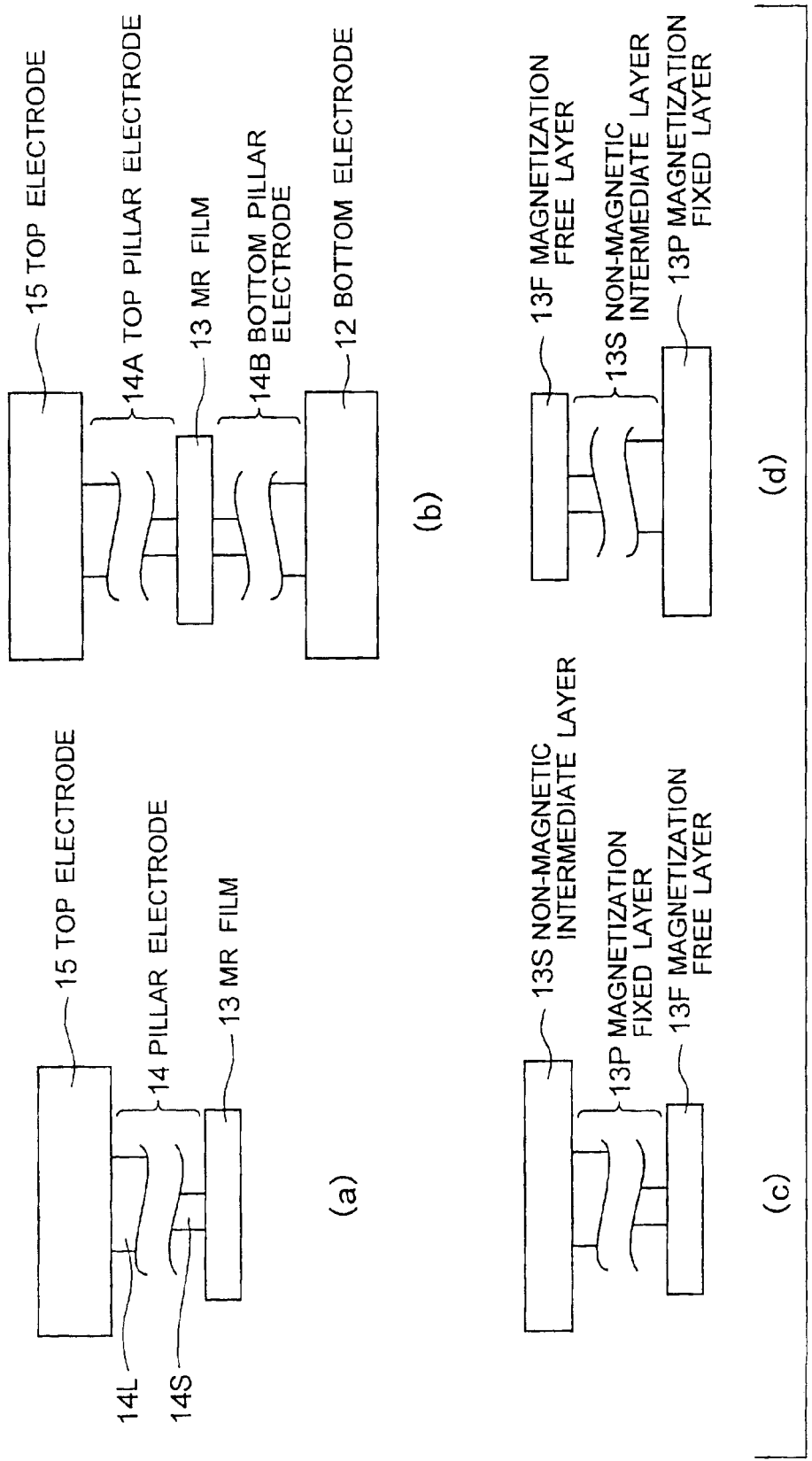
FIGS. 14(a)–14(d) are sectional views of the fourth embodiment of a magnetoresistance effect element according to the present invention.

FIG. 14 is a conceptual drawing illustrating this construction. It can be also seen from FIG. 12 that the magnetic field due to current is small in a portion 14L having a large sectional area even if its height is large. Therefore, only the magnetic field M due to current from a portion 14S having a narrowed sectional area near the magnetoresistance effect film 13 may be substantially considered. In this case, the cross section in horizontal directions may have a shape of circle, or any one of other various shapes as will be described later in detail.

An example where this pillar electrode 14 is applied to the modified example 1-2 is shown in FIG. 14(b). This example is more effective since the contribution of two pillar electrodes is moderated.

This pillar electrode 14 can be also applied to the magnetoresistance effect element in the modified example 1-1. Since the rotation of magnetization according to a magnetic field due to signal from a magnetic recording medium is carried out in a magnetization free layer, if the area of a pillar non-magnetic intermediate layer contacting the magnetization free layer is smaller than the area of the pillar non-magnetic intermediate layer contacting a magnetization fixed layer as shown in FIG. 14(c), it is possible to enhance its sensitivity.

In addition, if the area of the pillar non-magnetic intermediate layer contacting the magnetization fixed layer is smaller than the area of the pillar non-magnetic intermediate layer contacting the magnetization free layer as shown in FIG. 14(d), unnecessary magnetic field is not applied to the magnetization fixed layer, so that it is possible to improve the magnetization stability in the magnetization fixed layer.

MODIFIED EXAMPLE 4-1

Figure 15:
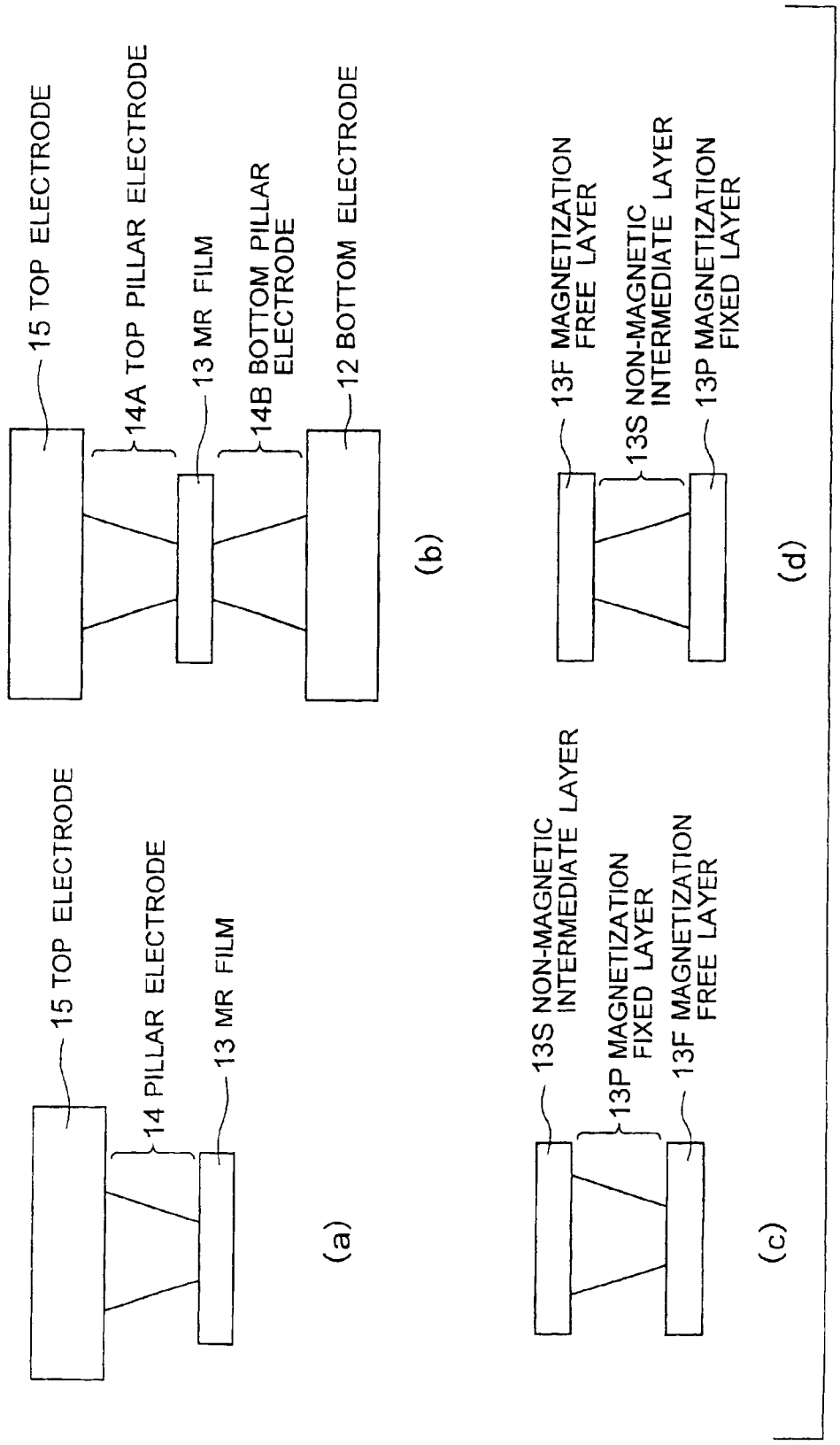
FIGS. 15(a)–15(d) are schematic diagrams showing a modified example 4-1 of a magnetoresistance effect element in the fourth embodiment of the present invention, and the sectional area of a pillar electrode is linearly varied from one surface contacting a top electrode to the other surface contacting the magnetoresistance effect film.

FIG. 15 is a conceptual drawing showing a construction wherein the sectional area of the pillar electrode 14 is linearly varied from one surface contacting the top electrode 15 to the other surface contacting the magnetoresistance effect film 13. Such a pillar electrode 14 can be prepared by one lift off if a tapered resist is used. Of course, this pillar electrode 14 can also be applied to the magnetoresistance effect element in any one of the modified example 1-1 and 1-2.

An example where this pillar electrode 14 is applied to the modified example 1-2 is shown in FIG. 15(b). This example is more effective since the contribution of two pillar electrodes is moderated.

This pillar electrode 14 can be also applied to the magnetoresistance effect element in the modified example 1-1. Since the rotation of magnetization according to a magnetic field due to signal from a magnetic recording medium is carried out in a magnetization free layer, if the area of a pillar non-magnetic intermediate layer contacting the magnetization free layer is smaller than the area of the pillar non-magnetic intermediate layer contacting a magnetization fixed layer as shown in FIG. 15(c), it is possible to enhance its sensitivity.

In addition, if the area of the pillar non-magnetic intermediate layer contacting the magnetization fixed layer is smaller than the area of the pillar non-magnetic intermediate layer contacting the magnetization free layer as shown in FIG. 15(d), unnecessary magnetic field is not applied to the magnetization fixed layer, so that it is possible to improve the magnetization stability in the magnetization fixed layer.

MODIFIED EXAMPLE 4-2

Figure 16:
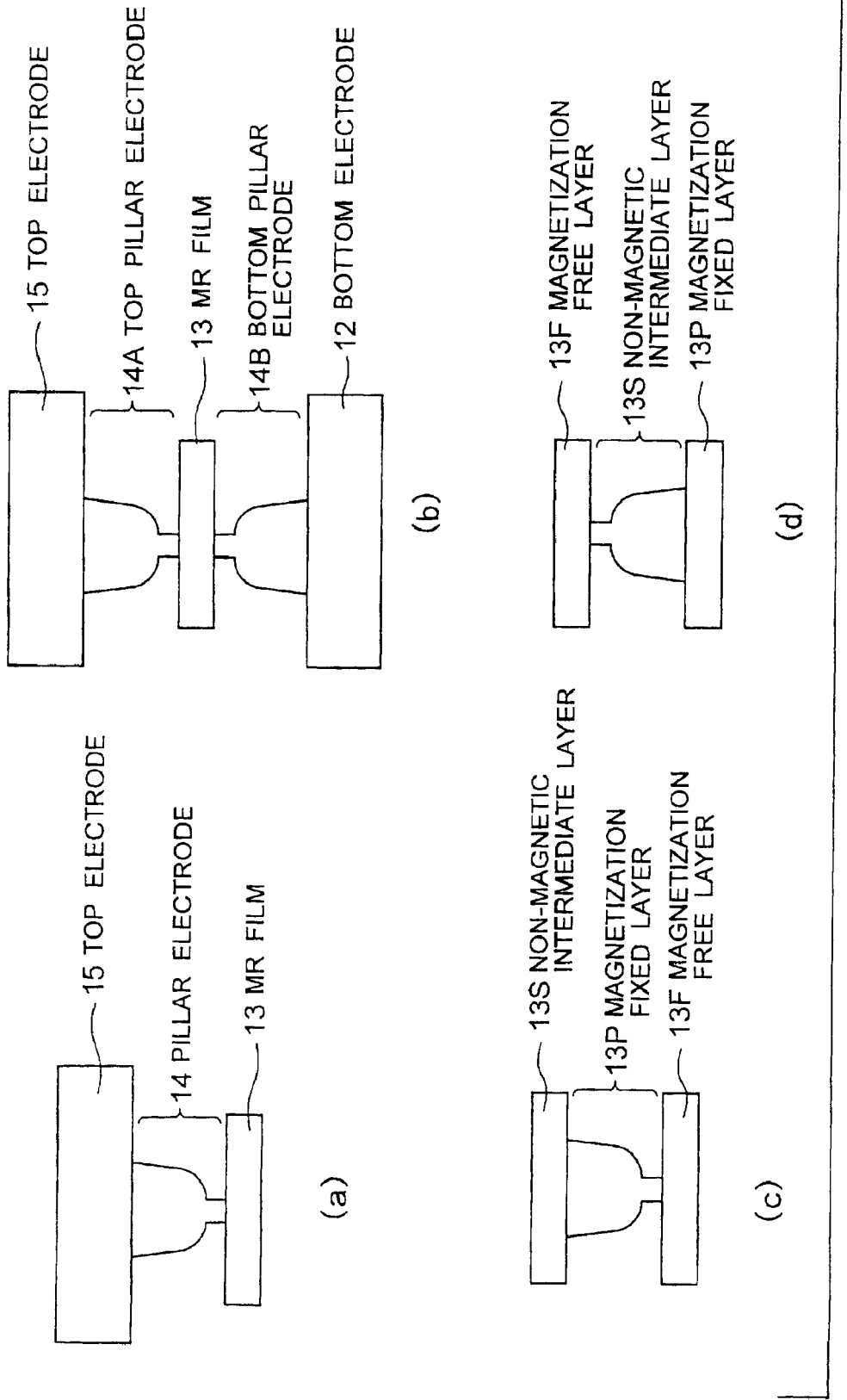
FIGS. 16(a)–16(d) are schematic diagram showing a modified example 4-2 of a magnetoresistance effect element in the fourth embodiment of the present invention, and the magnetoresistance effect element is capable of being generally divided into two parts by the sectional area of a pillar electrode.

FIG. 16 is a conceptual drawing illustrating a construction wherein the sectional area of the pillar electrode 14 is generally divided into two stages. Thus, it is possible to increase the difference between the area $S_{MR}$ of a surface of the pillar electrode 14 contacting the magnetoresistance effect film 13 and the area $S_{upperlead}$ of a surface of the pillar electrode 14 contacting the top electrode 15. As this difference increases, the magnetic field M due to current from a portion of the pillar electrode 14 having a large sectional area can be reduced. By the inventor's study, it was revealed that the pillar electrode 14 is preferably designed so that $S_{upperlead}/S_{MR} > 2000$.

However, even if the pillar electrode 14 is thus designed, if the portion having the small sectional area is long, the magnetic field M due to current increases as described above referring to FIGS. 13(a) and 13(b). Therefore, the height of the portion having the small sectional area is preferably 30 nm or less, and more preferably 15 nm or less.

An example where this pillar electrode 14 is applied to the modified example 1-2 is shown in FIG. 16(b). This example is more effective since the contribution of two pillar electrodes is moderated.

This pillar electrode 14 can be also applied to the magnetoresistance effect element in the modified example 1-1. Since the rotation of magnetization according to a magnetic field due to signal from a magnetic recording medium is carried out in a magnetization free layer, if the area of a pillar non-magnetic intermediate layer contacting the magnetization free layer is smaller than the area of the pillar non-magnetic intermediate layer contacting a magnetization fixed layer as shown in FIG. 16(c), it is possible to enhance its sensitivity.

In addition, if the area of the pillar non-magnetic intermediate layer contacting the magnetization fixed layer is smaller than the area of the pillar non-magnetic intermediate layer contacting the magnetization free layer as shown in FIG. 16(d), unnecessary magnetic field is not applied to the magnetization fixed layer, so that it is possible to improve the magnetization stability in the magnetization fixed layer.

FIFTH EMBODIMENT

As the fifth embodiment of the present invention, a construction wherein the magnetic field due to current in a pillar electrode is canceled.

Figure 17:
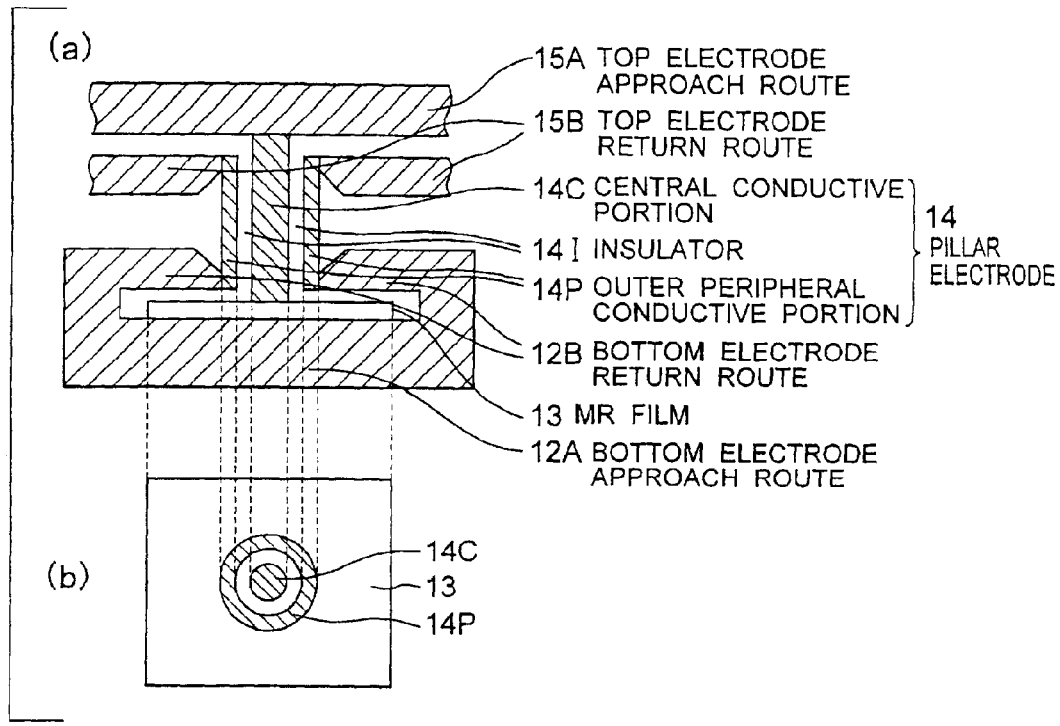
FIGS. 17(a) and 17(b) are schematic views of the fifth embodiment of a magnetoresistance effect element according to the present invention.

FIG. 17 is a conceptual drawing illustrating the construction of a principal part of a magnetoresistance effect element in this embodiment. That is, FIG. 17(a) is a drawing of its longitudinal section, and FIG. 17(b) is a drawing of horizontal section of its principal part.

This embodiment is characterized in that, in the construction illustrated in FIG. 1, the pillar electrode 14 is divided into a central conductive portion 14C and an outer peripheral conductive portion 14P, and a sense current Is is caused to go and return to cancel a magnetic field M due to current. The central conductive portion 14 and the outer peripheral conductive portion 14P are insulated from each other by means of an insulator 14I.

The sense current Is flows from a top electrode approach route 12A into the central conductive portion 14C to be applied to the magnetoresistance effect film 13 in a direction perpendicular thereto. Then, the sense current Is flows from a bottom electrode approach route 12A to a return route 12B arranged on the magnetoresistance effect film to pass through the outer peripheral conductive portion 14P to a top electrode return route 15B. Of course, the sense current Is may flow in the opposite direction. If the sense current Is is thus caused go and return in the pillar electrode 14, the magnetic field M due to current applied to the magnetoresistance effect film 13 can be reduced, and can be ideally zero.

Of course, this can also be similarly applied to the modified examples 1-1 and 1-2 illustrated in FIGS. 2 and 3.

SIXTH EMBODIMENT

As the sixth embodiment of the present invention, a construction wherein a magnetic field due to current in a pillar electrode is shielded will be described below.

Figure 18:
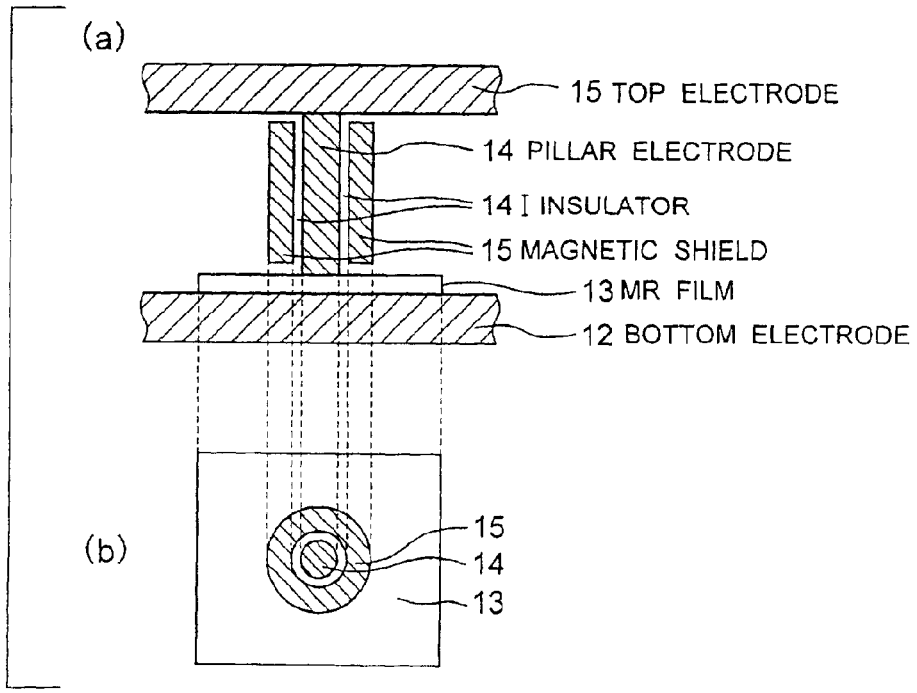
FIGS. 18(a) and 18(b) are schematic views of the sixth embodiment of a magnetoresistance effect element according to the present invention.

FIG. 18 is a conceptual drawing illustrating the construction of a principal part of a magnetoresistance effect element in this embodiment. That is, FIG. 18(a) is a drawing of its longitudinal section, and FIG. 18(b) is a drawing of horizontal section of its principal part.

In this embodiment, a magnetic shield 15 is arranged around a pillar electrode 14 via an insulator 14I. If such a magnetic shield 15 is provided, the magnetic field M due to current applied to the magnetoresistance effect film 13 can be reduced, and can be ideally zero.

SEVENTH EMBODIMENT

In the fourth through sixth embodiments, the design of the element for reducing or suppressing the influence of the annular magnetic field M due to current from the pillar electrode has been described.

This embodiment relates to an approach to the avoidance of a crosstalk from an adjacent track during reading, which is caused by a magnetic field M due to current.

Figure 19:
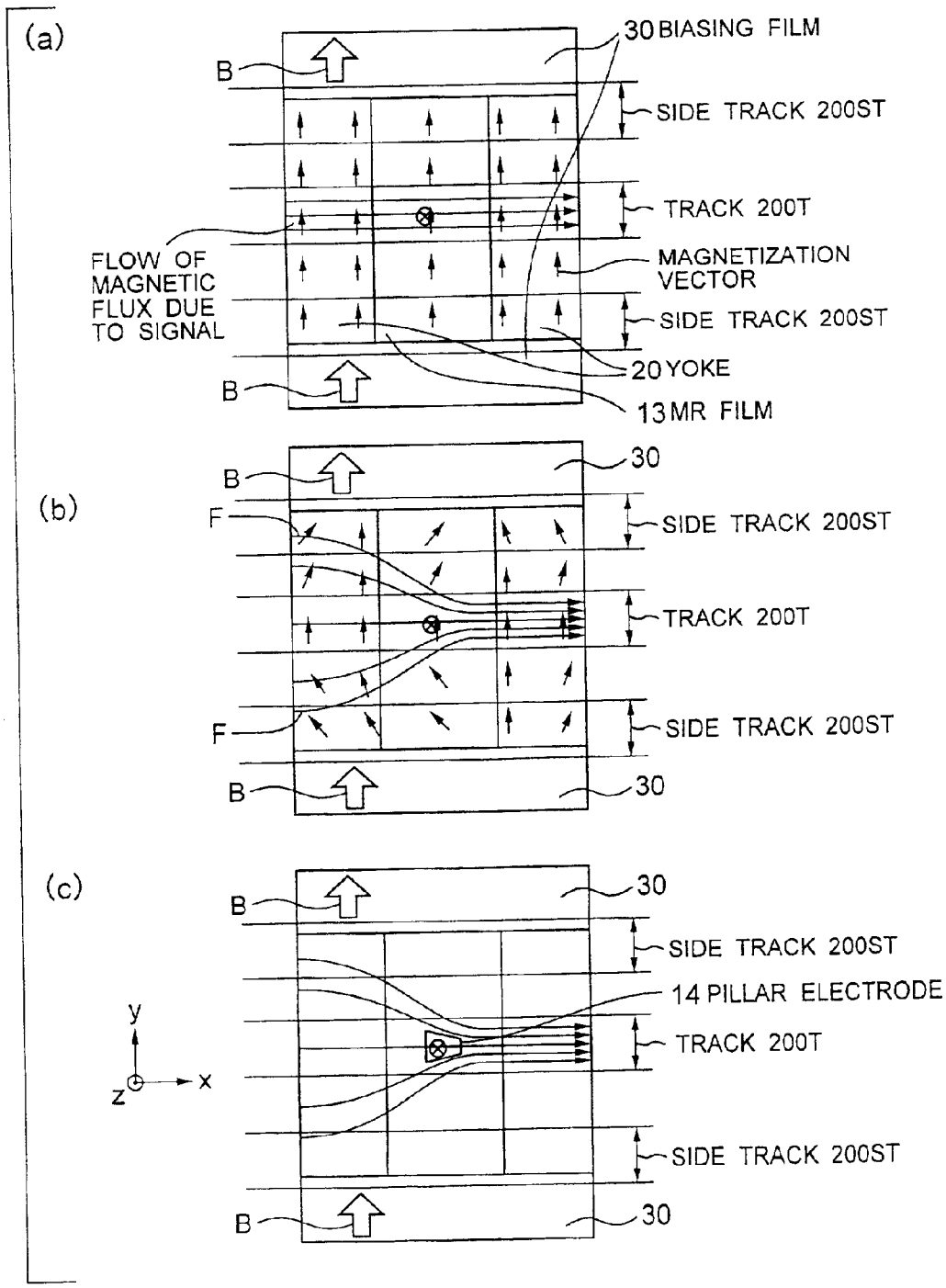
FIG. 19 is a plan view of a magnetoresistance effect element when a CPP type GMR film is mounted on a planar yoke head, wherein a magnetization distribution in a yoke and a magnetization free layer is described by arrows and a traveling direction of a magnetic flux due to signal in the case of the magnetization distribution is shown, FIG. 19(a) showing a magnetization distribution and the flow of a magnetic flux due to signal when the influence of a magnetic field due to a sense current flowing through a pillar electrode can be ignored, FIG. 19(b) showing a magnetization distribution and the flow of a magnetic flux due to signal when the sense current of the column electrode can not be ignored, and FIG. 19(c) showing the flow of a magnetic flux due to signal when the sense current of the pillar electrode can not be ignored, and the position and shape of the pillar electrode suitable therefor, as the seventh embodiment of the present invention.

FIG. 19 is a conceptual drawing showing a plane construction of a planar yoke head on which a CPP type GMR element is mounted.

FIG. 19(a) shows a magnetization distribution (arrows) when the influence of a magnetic field M due to current is small to an extent that it can be ignored. Biasing films 30, 30 of a magnetically hard film or an antiferromagnetic film are provided, so that each of the magnetization free layer 13F of a magnetoresistance effect film and yokes 20 is formed as a single magnetic domain by a magnetic field B due to bias generated by the biasing films 30, 30. Thus, the magnetic permeability with respect to a track longitudinal direction T in any portion of the magnetization free layer 13F and the yokes 20 is maximum, so that magnetization enters only in the track longitudinal direction T. In addition, the magnetic permeability on the track is maximum, so that only the magnetization on the track clearly rotates.

FIG. 19(b) shows a magnetization distribution when a reflux current M remains to have the same intensity as that of a magnetic field B due to bias. In this case, the magnetization (arrows) of the magnetization free layer 13F and the yokes 20 rotates as shown in the figure. At this time, the magnetization (arrows) is deviated from the cross direction of the track 200T in a portion deviated from the track 200T, so that the direction of a high magnetic permeability is not the track longitudinal direction in some place. At this time, there is some possibility that a magnetic flux F due to signal from an adjacent side track 200ST may enter in a direction perpendicular to magnetization to generate a crosstalk to deteriorate off track characteristics. In other words, the magnetization distribution of the magnetization free layer 13F and the yokes 20 is changed by the magnetic field M due to current to form a magnetic permeable lens, so that the magnetic flux from the adjacent track also converges.

In order to prevent the readout of such a converging magnetic flux from the adjacent track, the cross section of the pillar electrode 14 may have a shape of trapezoid as illustrated in FIG. 19(c). Thus, the magnetic flux F from the side track does not enter the active region 13A of the magnetoresistance effect film, so that off track characteristics are improved.

In this case, when the direction of the magnetic field B due to bias is +y direction and when the direction of the sense current Is is −z direction, the positional relationship is required so that the shorter side of the trapezoid is arranged on the side of +x and the longer side thereof is arranged on the side of −x.

MODIFIED EXAMPLE 7-1

If the shape of the cross section of the pillar intermediate non-magnetic film 13S in the modified example 1-3 illustrated in FIG. 5 is the same trapezoid as that illustrated in FIG. 19, off track characteristics can be improved.

EIGHTH EMBODIMENT

When a magnetoresistance effect film is mounted on a planar yoke head, if the distance between the magnetization free layer of the magnetoresistance effect film and yokes is shortened, the flow of a magnetic flux due to signal is smooth. If a vertically current applying magnetoresistance effect film is mounted, a bottom electrode is arranged therebetween, so that the distance between the magnetization free layer and the yokes is relatively long.

On the other hand, this embodiment relates to a design wherein the distance between a magnetization free layer and yokes is decreased.

Figure 20:
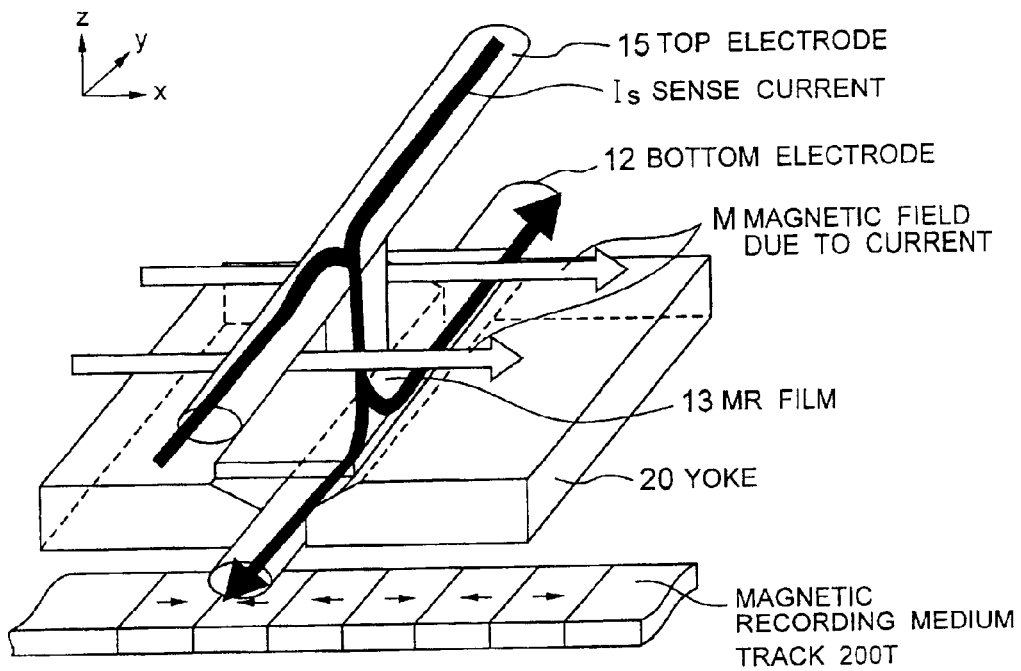
FIG. 20 is a perspective view of the eighth embodiment of a magnetoresistance effect element according to the present invention.

FIG. 20 is a schematic perspective view showing the construction of a principal part of a magnetic head in this embodiment. Also in this figure, the same reference numbers are given to the same element as those described above referring to FIGS. 1 through 19 and 31 to omit the detailed descriptions thereof.

If a bottom electrode 12 is arranged in a gap between yokes 20 and 20 as shown in this figure, the distance between a magnetoresistance effect film 13 and the yokes 20. Furthermore, a pair of biasing films of a magnetically hard film or an antiferromagnetic film for applying a magnetic field due to bias to the yokes 20 and the magnetization free layer 13F in y direction are provided in the front and rear sides in the figure although they are not shown in FIG. 20.

In the construction of FIG. 20, there is a problem in that the magnetic field due to current from a bottom electrode 12 is applied to the magnetoresistance effect film 13 and the yokes 20. For example, if a sense current Is is caused to flow through a pillar electrode 14 in −z direction, a magnetic field M due to current is generated in +x direction.

On the other hand, if a top electrode 15 is arranged in parallel to the bottom electrode 12 as shown in the figure so that the sense current goes and returns, the magnetic field M due to current applied from the top electrode 15 to the bottom electrode 12 can be substantially ignored.

Figure 21:
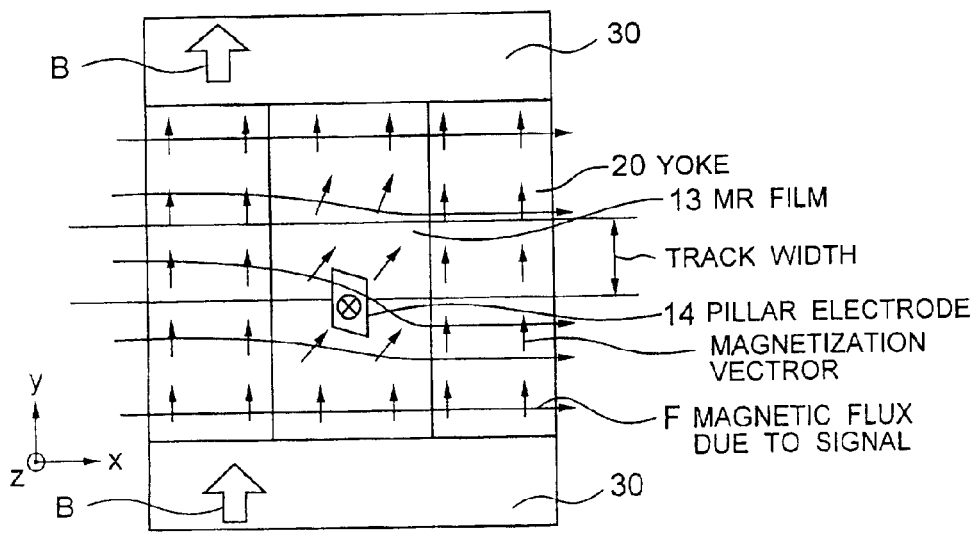
FIG. 21 is a plan view of the eighth embodiment of a magnetoresistance effect element according to the present invention, wherein a magnetization distribution in a yoke and a magnetization free layer, the flow of a magnetic flux due to signal determined by the distribution, and the position and shape of a pillar electrode suitable for the flow are shown.

However, the magnetic field due to current applied to the magnetoresistance effect film 13 is further increased, so that the magnetization (arrows) rotates particularly in the central portion of the element to have an x component as shown in the magnetization distribution of FIG. 21. Since the magnetic permeability in a direction perpendicular to the direction B of magnetization in the biasing films 30 is highest, the magnetic flux entering the yokes 20 on the straight in the track longitudinal direction (x direction) from a magnetic recording medium is bent in the magnetization free layer of the magnetoresistance effect film as shown by arrows in the figure. That is, the "skew" is caused in the magnetic flux F due to signal.

In view of this, if the shape of the horizontal cross section of the pillar electrode 14 is a parallelogram as shown in FIG. 21 and if the pillar electrode 14 is provided in a portion on which the magnetic flux F due to signal from the track concentrates, the active region 13A of the magnetoresistance effect film can be set at a sensitive place, so that it is possible to obtain a high output.

Figure 22:
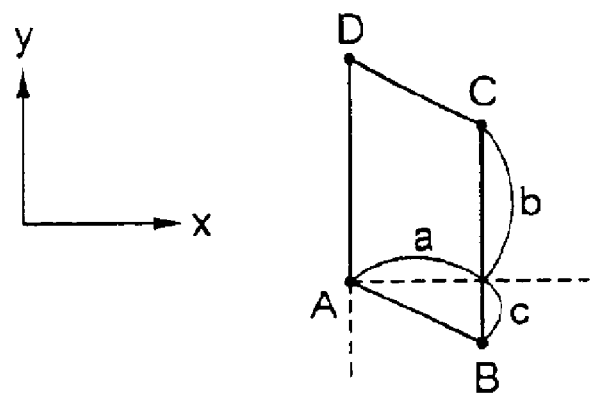
FIG. 22 is an illustration showing the details of the shape of the pillar electrode shown in FIG. 21.

Specifically, when the direction of the magnetic field B due to bias is +y direction and the direction of the sense current Is is −z direction, the four vertexes of the parallelogram of the horizontal cross section of the pillar electrode 14 are designed so that B(a, −c), C(a, b) and D(0, b+c) assuming that A(0, 0) as shown in FIG. 22. That is, the shape of a surface of the pillar electrode 14 contacting the magnetoresistance effect film has an edge portion which is inclined from a direction perpendicular to the magnetizing direction of the yokes 20 toward the magnetization rotating direction of the magnetization free layer of the magnetoresistance effect film (sides DC and AB in this example). In addition, the pillar electrode 14 is arranged so as to be shifted from the center of the magnetoresistance effect film 13 in −y direction.

MODIFIED EXAMPLE 8-1

It is more effective if the shape of the horizontal cross section of the pillar electrode 14 or the pillar intermediate non-magnetic layer 13S (see FIG. 5) is combined with the seventh embodiment so as to be a shape having both characteristics of a parallelogram and a trapezoid.

Figure 23:
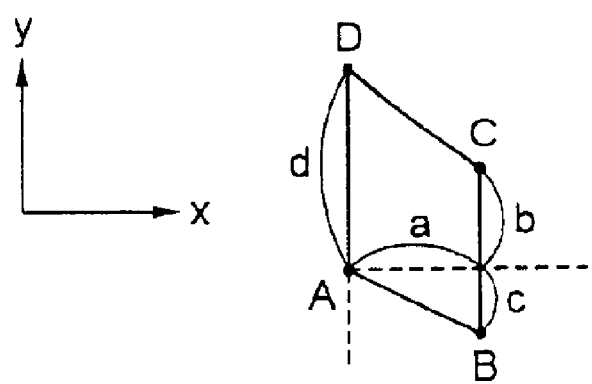
FIG. 23 is an illustration for explaining the sectional shape of a pillar electrode of a magnetoresistance effect element when the seventh and eighth embodiments of the present invention are combined.

That is, when the direction of the magnetic field B due to bias is +y direction and the direction of the sense current Is is −z direction, the four vertexes may be designed so that B(a, −c), C(a, b) and D(0, d) (d>b+c) assuming that A (0, 0) as shown in FIG. 23. Also in this case, the shape of a surface of the pillar electrode 14 contacting the magnetoresistance effect film has an edge portion which is inclined from a direction perpendicular to the magnetizing direction of the yokes 20 toward the magnetization rotating direction of the magnetization free layer of the magnetoresistance effect film (sides DC and AB in this example). In addition, the shape of a surface of the pillar intermediate nom-magnetic layer 13S contacting the stacked film 13P or the stacked film 13F has an edge portion which is inclined from a direction perpendicular to the magnetizing direction of the yokes 20 toward the magnetization rotating direction of the magnetization free layer of the magnetoresistance effect film (sides DC and AB in this example).

MODIFIED EXAMPLE 8-2

The concept of this embodiment can be applied to the magnetoresistance effect film 13 wherein the intermediate non-magnetic layer 13S is formed so as to have a pillar shape as illustrated in FIG. 5. That is, if the pillar non-magnetic layer 13S is provided at a position as shown in FIG. 22 or 23 so as to have a shape as shown therein, it is possible to obtain a high output.

NINTH EMBODIMENT

When the bottom electrode is arranged in the gap between the yokes as the above described eighth embodiment, if the top electrode is arranged in parallel thereto and if the shape of the horizontal cross section of the pillar electrode is the shape shown in FIG. 22, it is possible to avoid the effects of the rotation of magnetization in the magnetization free layer, which is caused by the magnetic field due to current from a portion other than the pillar electrode.

On the other hand, in this embodiment, a construction for preventing the rotation of magnetization caused by such a magnetic field due to current.

Figure 24:
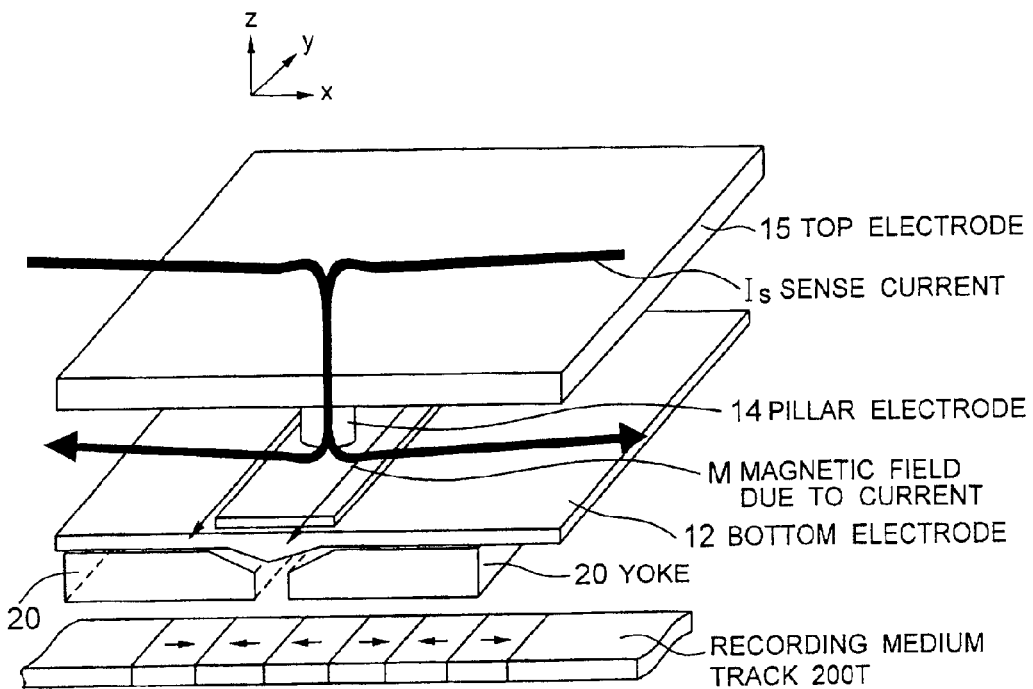
FIG. 24 is a perspective view of the ninth embodiment of a magnetoresistance effect element according to the present invention.

FIG. 24 is a schematic perspective view showing the construction of a principal part of a magnetic head in this embodiment. Also in this figure, the same reference numbers are given to the same elements as those described above referring to FIGS. 1 through 23 and 31 to omit the detailed explanations thereof.

In this embodiment, as illustrated in FIG. 24, a bottom electrode 12 and a top electrode 15 are taken out in a longitudinal direction of a recording track 200T to cause a sense current Is to go and return. Thus, the direction of a magnetic field M due to current applied to a magnetization free layer 13F by the top electrode 15 and the bottom electrode 12 can be the same as the direction of a magnetic field B due to bias which is caused by a pair of biasing films (not shown). Specifically, if a sense current is applied to a pillar electrode 14 in a −z direction, the direction of the magnetic field M due to current is −y direction.

MODIFIED EXAMPLE 9-1

Figure 25:
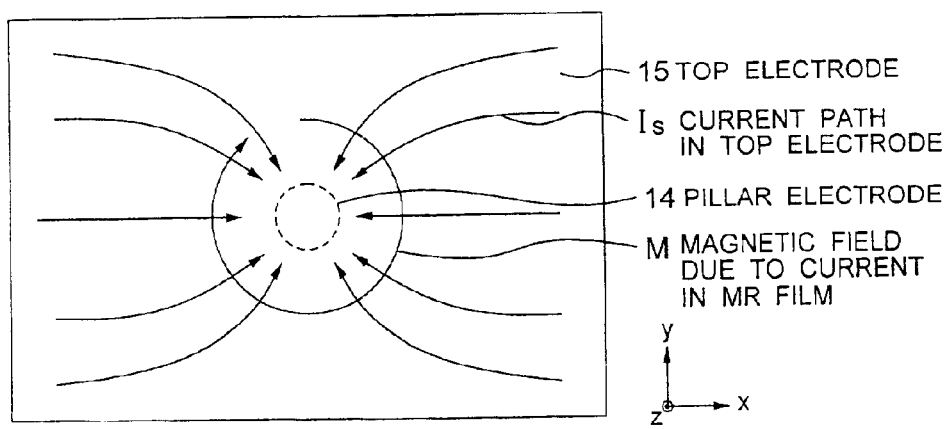
FIG. 25 is a plan view of a top electrode in the ninth embodiment of the present invention, wherein current paths and a magnetic field due to current generated in a magnetoresistance effect film by the current paths are shown by arrows.

In fact, for example, a current distribution shown in FIG. 25 is formed in the top electrode 15 since the sense current Is concentrates on the pillar electrode 14. In this case, a current distribution in the opposite direction thereto is formed in the bottom electrode 12. Then, an annular magnetic field M due to current shown in FIG. 25 is generated in the magnetoresistance effect film 13.

Figure 26:
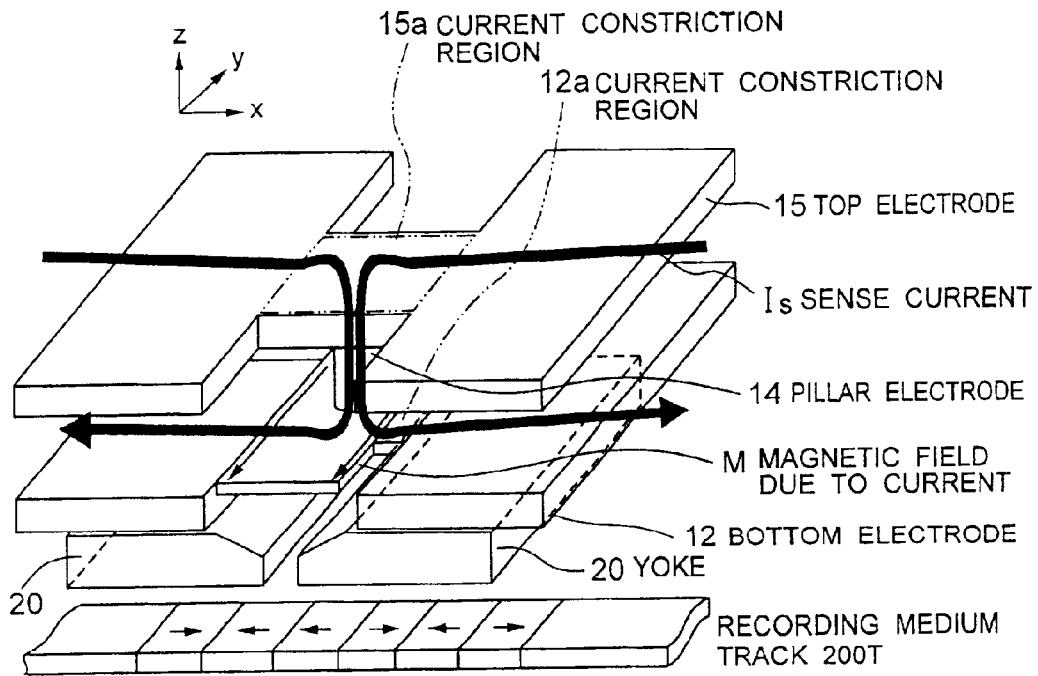
FIG. 26 is a perspective view of a modified example 9-1 of a magnetoresistance effect film, wherein the top and bottom electrodes in the ninth embodiment of the present invention are narrowed at the position of a pillar electrode.
Figure 27:
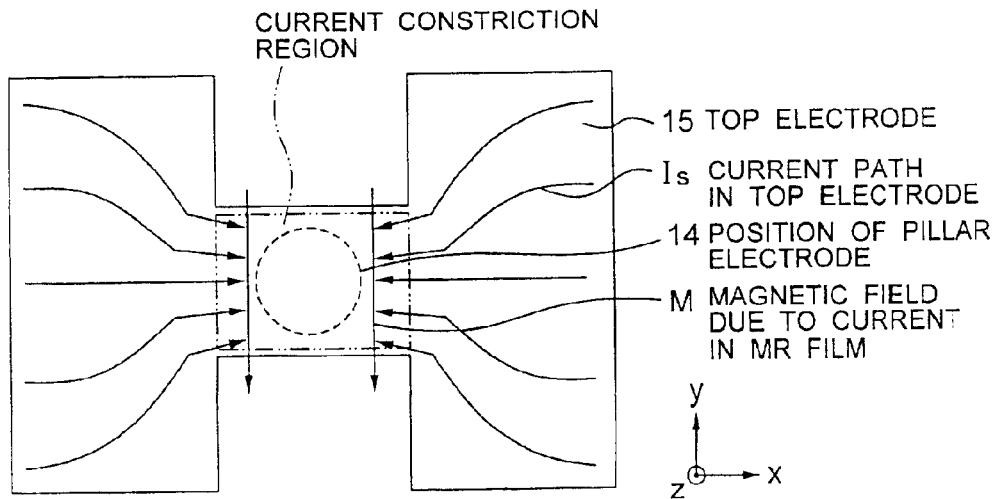
FIG. 27 is an illustration wherein current paths in a top electrode in a modified example of the present invention, and a magnetic field due to current generated in a magnetoresistance effect film by the current paths are shown by arrows.

In order to avoid this, the top electrode 15 and the bottom electrode 12 are provided current constriction regions 15a and 12a, respectively, as illustrated in FIG. 26. These current constriction regions have a shape which is narrowed in the vicinity of the pillar electrode 14. Thus, as shown in FIG. 27, the current distribution does not concentrate in the vicinity of the pillar electrode 14. For example, if a current is applied to the pillar electrode 14 in −z direction, the direction of the magnetic field due to current applied to the magnetoresistance effect film 13 can be generally −y direction as shown in FIG. 27. Furthermore, only one of the top electrode 15 and the bottom electrode 12 may be provided with the current constriction region.

TENTH EMBODIMENT

As the tenth embodiment of the present invention, a magnetic reading system according to the present invention will be described below. The magnetoresistance effect elements or the magnetic heads according to the first through the ninth embodiments of the present invention can be incorporated in, e.g., a recording/reproducing integral magnetic head assembly, to be mounted in a magnetic reproducing system.

Figure 28:
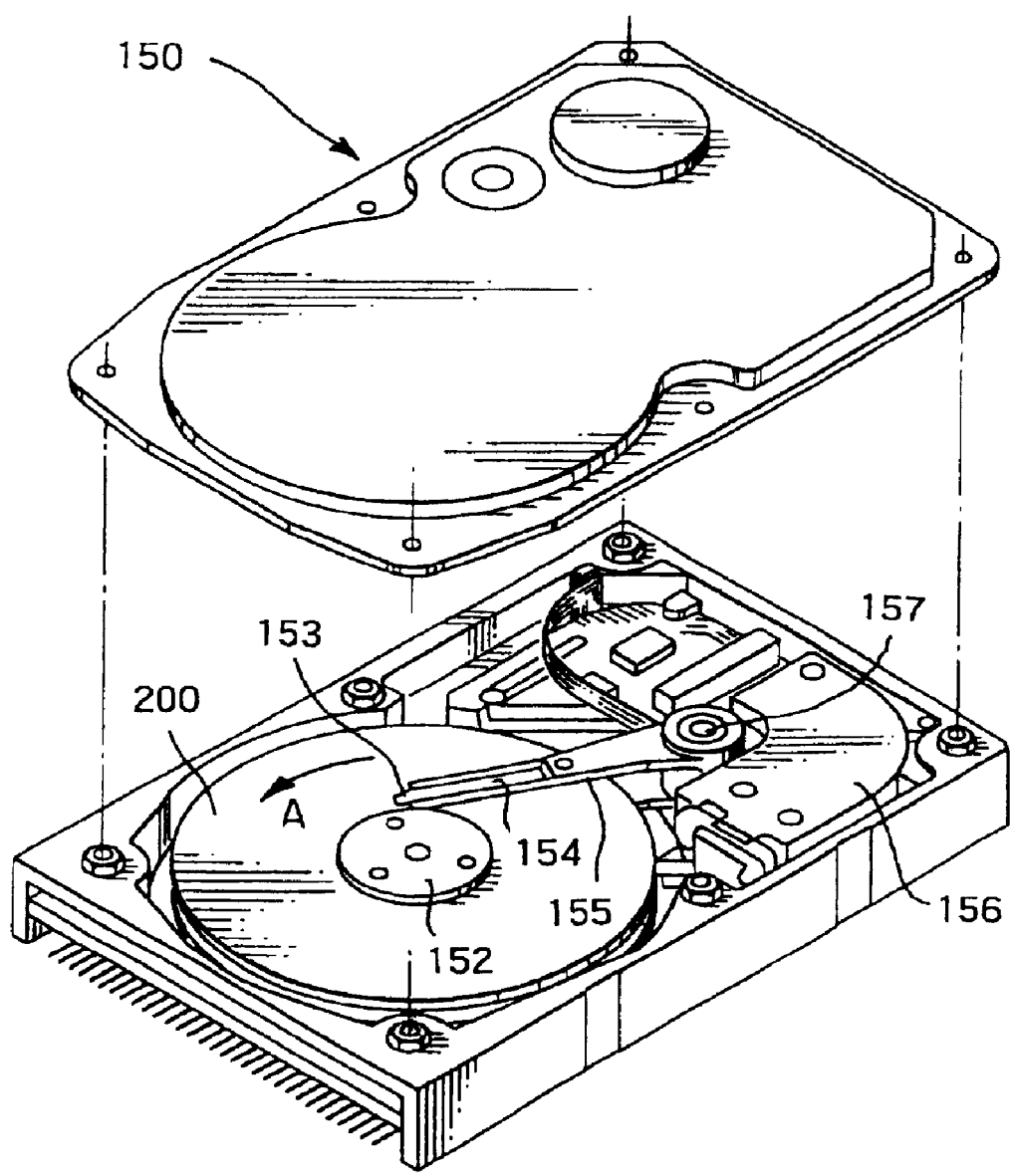
FIG. 28 is a perspective view illustrating the schematic construction of a principal part of a magnetic reproducing system according to the present invention.

FIG. 28 is a perspective view of a principal part showing an example of a schematic construction of such a magnetic recording system. That is, a magnetic recording and/or reproducing system 150 according to tenth embodiment of the present invention is a system of a type in which a rotary actuator is used. In this figure, a longitudinal recording or vertical recording magnetic disk 200 is mounted on a spindle 152, and is rotated in a direction of arrow A by means of a motor (not shown) which is driven in response to a control signal from a drive unit control part (not shown). The magnetic disk 200 has a longitudinal recording or vertical recording layer. A head slider 153 for recording/reading information in the magnetic disk 200 is mounted on the tip of a thin-film-like suspension 154. The head slider 153 has a magnetic head, which uses a magnetoresistance effect element in any one of the above described embodiment, in the vicinity of the tip thereof.

If the magnetic disk 200 rotates, the medium facing surface (ABS) of the head slider 153 is held so as to be spaced from the surface of the magnetic disk 200 by a predetermined flying height.

The suspension 154 is connected to one end of an actuator arm 155 which has a bobbin portion for holding a driving coil (not shown). On the other end of the actuator arm 155, there is provided a voice coil motor 156 which is a kind of linear motor. The voice coil motor 156 comprises a driving coil (not shown) wound onto the bobbin portion of the actuator arm 155, and a magnetic circuit comprising a permanent magnet and a facing yoke which face each other so as to sandwich the coil therebetween.

The actuator arm 155 is held by ball bearings (not shown) which are provided at two places above and below a fixed axis 157, and is rotatable and slidable by the voice coil motor 156.

Figure 29:
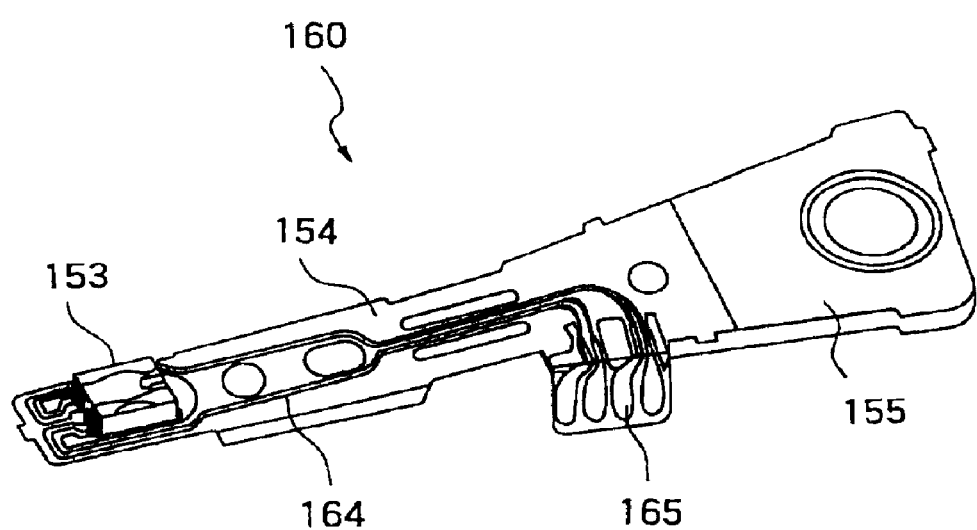
FIG. 29 is an enlarged perspective view of a magnetic head assembly in front of an actuator arm 155, viewed from the side of a disk.

FIG. 29 is an enlarged perspective view of a magnetic head assembly in front of the actuator arm 155 viewed from the side of a disk. That is, a magnetic head assembly 160 has an actuator arm 151 having, e.g., a bobbin portion for holding a driving coil, and a suspension 154 is connected to one end of the actuator arm 155.

On the tip of the suspension 154, a head slider 153 having a reading magnetic head using any one of the above described magnetoresistance effect elements referring to the first embodiment through the ninth embodiment is mounted. A recording head may be combined therewith. The suspension 154 has a lead wire 164 for writing/reading signals. This lead wire 164 is electrically connected to the respective electrodes of the magnetic head incorporated in the head slider 153. In the figure, reference number 165 denotes an electrode pad of the magnetic head assembly 160.

Between the medium facing surface (ABS) of the head slider 153 and the surface of the magnetic disk 200, a predetermined flying height is set.

Figure 30:
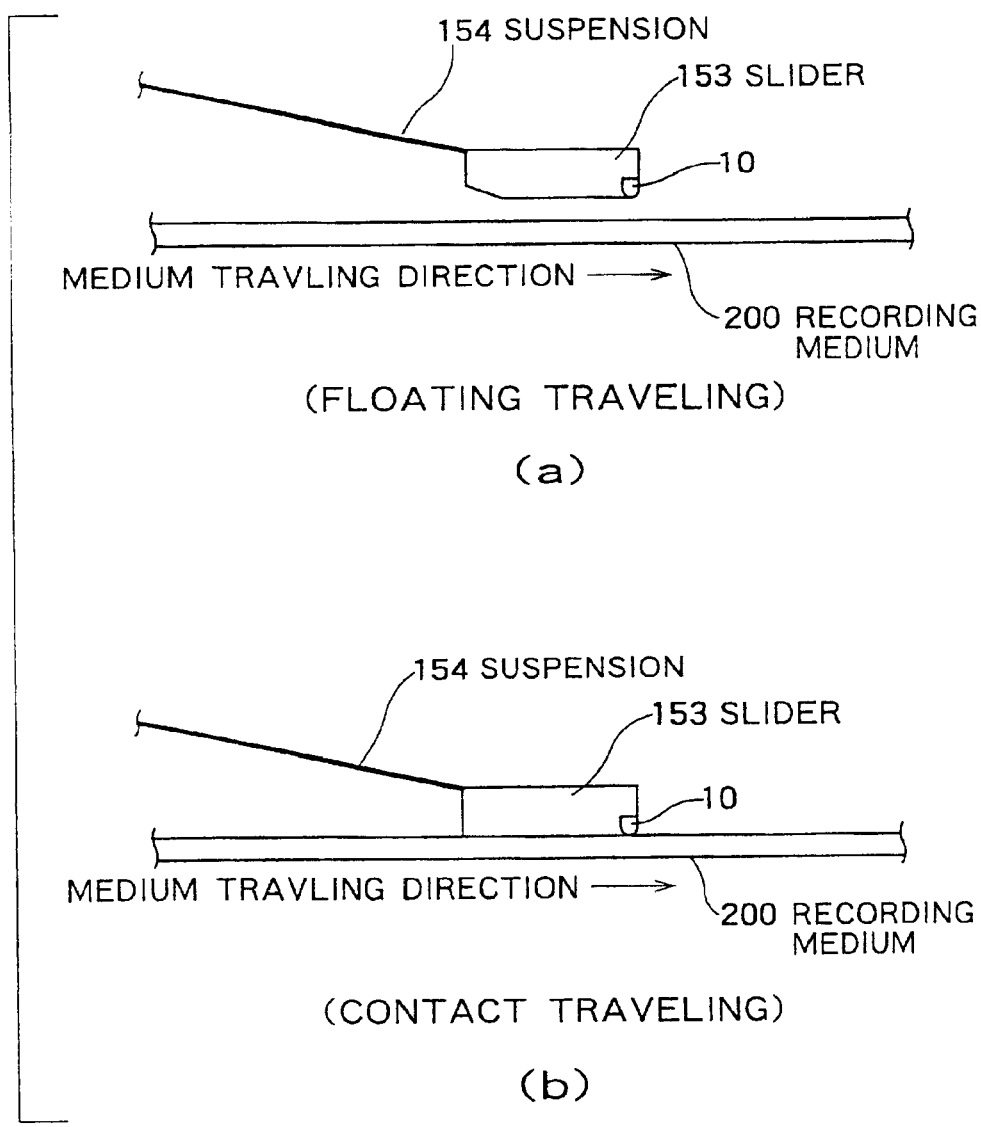
FIG. 30(a) is a conceptual drawing showing the relationship between a head slider 153 and a magnetic head 200 when a flying height is a predetermined positive value.
FIG. 30(b) is a conceptual drawing showing the relationship between such a "contact traveling" the head slider 153 and the magnetic head 200.
Figure 31:
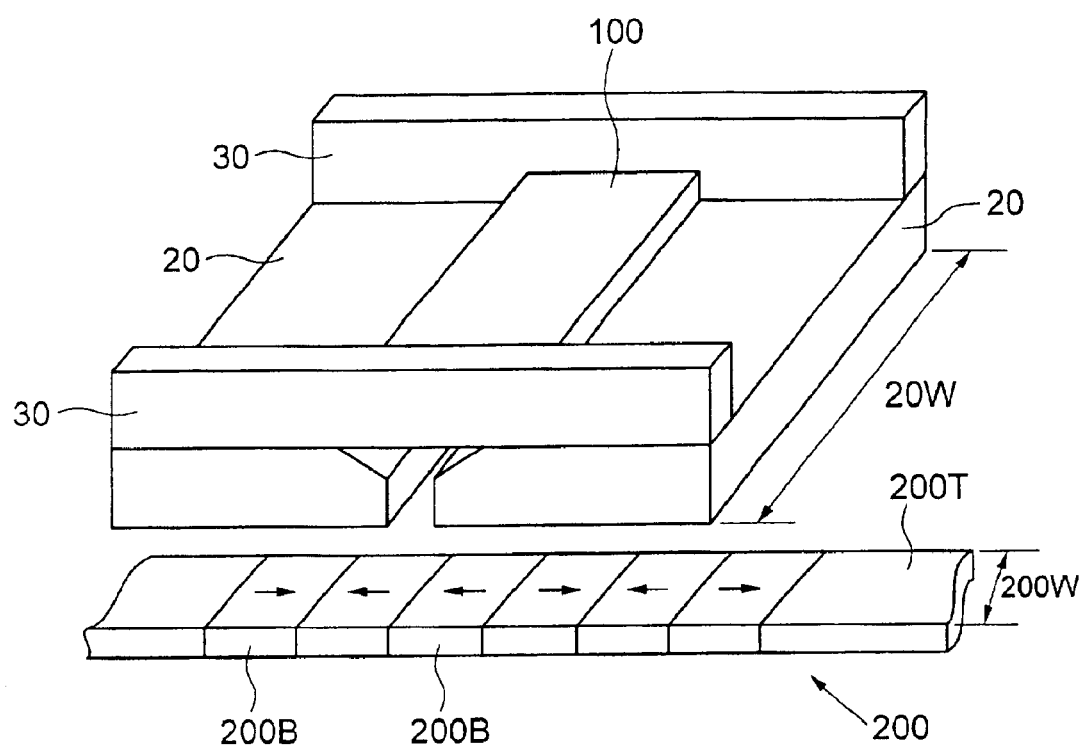
FIG. 31 is a schematic perspective view showing the construction of a principal part of a planar type head.

FIG. 30(a) is a conceptual drawing showing the relationship between the head slider 153 and the magnetic disk 200 when the flying height is a predetermined positive value. As illustrated in this figure, in usual many magnetic recording systems, the slider 153 including the magnetic head 10 operates while flying at a predetermined height from the surface of the magnetic disk 200. According to the tenth embodiment of the present invention, such a "flying traveling type" magnetic recording system can also read at low noises with a higher resolution than conventional systems. That is, by adopting any one of the above described magnetoresistance effect elements referring to the first embodiment through the ninth embodiment, weak magnetization information from a track to be read can be surely read. That is, since it is possible to reduce the cross talk from adjacent recording track, it is possible to reduce the track pitch to greatly improve the recording density.

On the other hand, if the recording density further increases, it is required to lower the flying height to glide the slider nearer to the magnetic disk 200 to read information. For example, in order to obtain a recording density of about 40 G (giga) bits per one square inch, the spacing loss due to the flying of the slider is too large, so that it is not possible to ignore the problem of the collision of the head 10 with the magnetic disk 200 due to the very low flying.

For that reason, a system for traveling the slider while positively causing the magnetic head 10 to contact the magnetic disk 200 is also considered.

FIG. 30(b) is a conceptual drawing showing the relationship between such a "contact traveling type" head slider 153 and the magnetic disk 200. The magnetic head according to the present invention can also be mounted on the "contact traveling type" slider by providing a diamond-like carbon (DLC) lubricating film on the contact surface to the medium. Therefore, the "contact traveling type" magnetic reading system illustrated in FIG. 24(b) can also greatly reduce crosstalk from adjacent tracks to greatly reduce the track pitch in comparison with conventional systems to stably carry out a recording/reading operation in a medium having a higher density.

As described above, referring to the accompanying drawings, the present invention has been described. However, the present invention should not be limited to those described in the respective examples.

For example, the material and the shape of elements of the magnetic head should not be limited to those described in the respective examples, and the present invention can include all embodiments, which can be selected by persons with ordinary skill, to provide the same effects.

The magnetic reproducing system may be a reproducing only system or a recording and/or reproducing system. In addition, the medium should not be limited to a hard disk, but it may be any one of all magnetic recording media, such as flexible disks and magnetic cards. Moreover, the magnetic reproducing system may be a so-called "removable" type system wherein a magnetic recording medium is removed from the system.

As described above, according to the present invention, it is possible to provide a magnetoresistance effect element capable of precisely defining the active region of an MR film in a CPP type MR element and of effectively suppressing the influence of a magnetic field due to current from an electrode, and a magnetic head and magnetic reproducing system using the same. Therefore, it is of great advantage to industry.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistance effect element comprising:
   a stacked film including a magnetization fixed layer in which the direction of magnetization is substantially fixed to one direction, and a magnetization free layer in which the direction of magnetization varies in accordance with an external magnetic field; and
   an electrode connected to a part of a principal plane of the stacked film,
   the magnetoresistance effect element having a resistance varying in response to a relative angle between the direction of magnetization in the magnetization fixed layer and the direction of magnetization in the magnetization free layer, the resistance being detected when a sense current is applied to the film planes of the magnetization fixed layer and the magnetization free layer via the electrode in a direction substantially perpendicular to the magnetization fixed layer and the magnetization free layer,
   the electrode comprising:
   a single pillar electrode portion substantially perpendicularly extending from the principal plane of the stacked film and having a sectional film area smaller than an area of the principal plane of the stacked film, and a feed portion connected to the single pillar electrode portion and extending from the single pillar electrode portion substantially in parallel to the principal plane of the stacked film, and the magnetoresistance effect element being configured such that the sense current flows only through the single pillar electrode portion.

2. A magnetoresistance effect element as set forth in claim 1, wherein the sectional area of the feed portion substantially in parallel to the principal plane of the stacked film is greater than the sectional area of the single pillar electrode portion.

3. A magnetoresistance effect element as set forth in claim 1, wherein the shape of a contact surface of the principal plane of the stacked film contacting the single pillar electrode portion is substantially a quadrilateral.

4. A magnetic head having a magnetoresistance effect element as set forth in claim 1.

5. A magnetoresistance effect element comprising:

a stacked film including a magnetization fixed layer in which the direction of magnetization is substantially fixed to one direction, and a magnetization free layer in which the direction of magnetization varies in response to an external magnetic field; and two electrodes, each of which is connected to a part of a corresponding one of both principal planes of the stacked film, the magnetoresistance effect element having a resistance varying in response to a relative angle between the direction of magnetization in the magnetization fixed layer and the direction of magnetization in the magnetization free layer, the resistance being detected when a sense current is applied to the film planes of the magnetization fixed layer and the magnetization free layer via the two electrodes in a direction substantially perpendicular to the magnetization fixed layer and the magnetization free layer, each of the two electrodes comprising:

a single pillar electrode portion substantially perpendicularly extending from the corresponding one of the both principal planes of the stacked film and having a sectional film area smaller than an area of the corresponding area of both principal planes of the stacked film, and a feed portion being connected to the single pillar electrode portion and extending from the single pillar electrode portion substantially in parallel to the both principal planes of the stacked film, and the magnetoresistance effect element being configured such that the sense current flows only through the single pillar electrode portions.

6. A magnetoresistance effect element as set forth in claim 5, wherein the sectional area of the feed portion substantially in parallel to the both principal planes of the stacked film is greater than the sectional area of the single pillar electrode portion.

7. A magnetoresistance effect element as set forth in claim 5, wherein the shape of a contact surface of each of the both principal planes of the stacked film contacting the single pillar electrode portion is substantially a quadrilateral.

8. A magnetic head having a magnetoresistance effect element as set forth in claim 5.

9. A magnetic reproducing system which has a magnetic head as set forth in claim 8 and which is capable of reading magnetic information stored in a magnetic recording medium.

* * * * *